(12) United States Patent
Tagaya et al.

(10) Patent No.: US 12,428,751 B2
(45) Date of Patent: Sep. 30, 2025

(54) CRYSTALLINE FILM OF OCTACALCIUM PHOSPHATE AND METHOD FOR PRODUCING THE SAME

(71) Applicants: NAGAOKA UNIVERSITY OF TECHNOLOGY, Nagaoka (JP); ALTECH CO., LTD., Tokyo (JP)

(72) Inventors: Motohiro Tagaya, Nagaoka (JP); Yanni Zhou, Nagaoka (JP); Zizhen Liu, Nagaoka (JP); Yoshinori Matsuura, Saitama (JP); Isamu Arakawa, Tokyo (JP)

(73) Assignees: Nagaoka University of Technology, Niigata (JP); Altech Co., Ltd., Tokyo (JP)

( * ) Notice: Subject to any disclaimer, the term of this patent is extended or adjusted under 35 U.S.C. 154(b) by 0 days.

(21) Appl. No.: 19/213,018

(22) Filed: May 20, 2025

(65) Prior Publication Data
US 2025/0277325 A1    Sep. 4, 2025

Related U.S. Application Data

(63) Continuation of application No. PCT/JP2024/002936, filed on Jan. 30, 2024.

(51) Int. Cl.
*C30B 29/14* (2006.01)
*C25D 13/02* (2006.01)
(Continued)

(52) U.S. Cl.
CPC ............ *C30B 29/14* (2013.01); *C25D 13/02* (2013.01); *C25D 13/12* (2013.01); *C30B 7/12* (2013.01);
(Continued)

(58) Field of Classification Search
CPC .......... C30B 29/14; C30B 7/12; C30B 29/68; C30B 33/00; C25D 13/02; C25D 13/12; G01N 29/022
See application file for complete search history.

(56) References Cited

U.S. PATENT DOCUMENTS

| | | | | |
|---|---|---|---|---|
| 2011/0192727 A1* | 8/2011 | Yates | ................... | H01M 8/1016 205/198 |
| 2012/0040269 A1* | 2/2012 | Yates | ................... | H01M 8/1004 429/495 |

(Continued)

FOREIGN PATENT DOCUMENTS

| | | | | |
|---|---|---|---|---|
| AU | 2021102400 A4 * | 7/2021 | ............... | C25D 9/08 |
| CA | 2187512 C * | 5/2007 | ............. | A61L 27/32 |

(Continued)

OTHER PUBLICATIONS

Ban et al., "Synthesis of Octacalcium Phosphate and its Transformation to Apatite", Japanese Society for Dental Materials and Devices, vol. 15, No. 3, pp. 210-217, 1996.
(Continued)

*Primary Examiner* — Francis C Gray
(74) *Attorney, Agent, or Firm* — Carrier, Shende & Associates P.C.; Joseph P. Carrier; Fulchand P. Shende

(57) ABSTRACT

Electrophoresis of an ethanol dispersion of an octacalcium phosphate (OCP) crystal is performed to form a multilayer deposited film of the OCP crystal on a cathode (gold sensor) that is an electrode made of a conductive material such as gold. The multilayer deposited film is subjected to ultrasonic cleaning to form a single-layer deposited film of the OCP crystal on the cathode. The OCP crystalline film formed on the gold sensor surface is a stable crystalline film having a layered structure in which a hydrated layer and an apatite layer are regularly repeated, where a specific crystal plane is oriented in a specific direction with the hydrated layer being an uppermost layer.

12 Claims, 24 Drawing Sheets

(51) Int. Cl.
  *C25D 13/12* (2006.01)
  *C30B 7/12* (2006.01)
  *C30B 29/68* (2006.01)
  *C30B 33/00* (2006.01)
  *G01N 29/02* (2006.01)
(52) U.S. Cl.
  CPC .............. *C30B 29/68* (2013.01); *C30B 33/00* (2013.01); *G01N 29/022* (2013.01)

(56) References Cited

U.S. PATENT DOCUMENTS

2021/0188639 A1* 6/2021 Kim .................... C01B 25/32
2023/0124295 A1   4/2023 Kim et al.

FOREIGN PATENT DOCUMENTS

| JP | H03-28197 A   | 2/1991  |
| JP | H05-221619 A  | 8/1993  |
| JP | H06-122510 A  | 5/1994  |
| JP | H08-261474 A  | 10/1996 |
| JP | 2018-202074 A | 12/2018 |
| JP | 2020-130766 A | 8/2020  |
| JP | 2021-502319 A | 1/2021  |
| WO | 2019/069825 A1| 4/2019  |

OTHER PUBLICATIONS

PCT/ISA/210, PCT/ISA/220 and PCT/ISA/237 from International Application No. PCT/JP2024/002936.

* cited by examiner

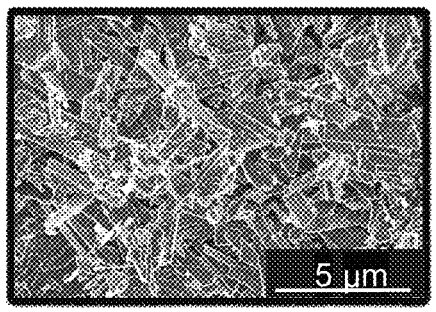
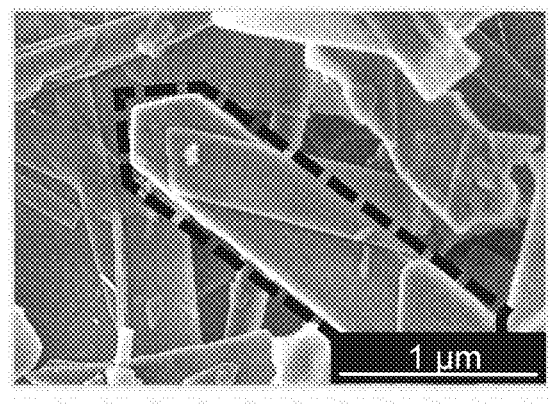
FIG. 4A
FIG. 4B
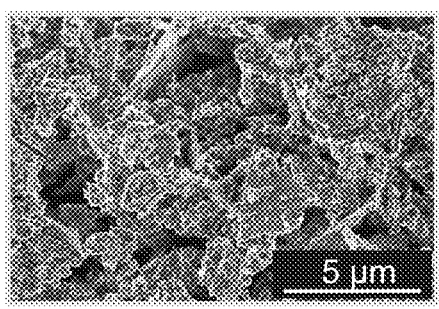
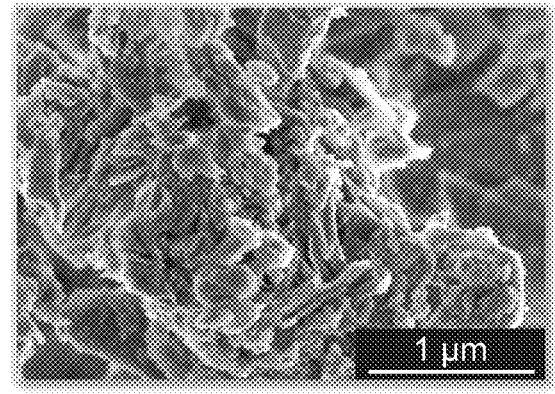
FIG. 5A
FIG. 5B

CRYSTALLINE FILM OF OCTACALCIUM PHOSPHATE AND METHOD FOR PRODUCING THE SAME

TECHNICAL FIELD

The present invention relates to a crystalline film of octacalcium phosphate and a method of producing a crystalline film of octacalcium phosphate.

BACKGROUND ART

When the mass of a measurement target substance in a sample is measured and quantified, a quartz crystal microbalance (QCM) sensor has conventionally been used. The QCM sensor performs measurements or the like based on the electrical properties, such as oscillation frequency and impedance, of a quartz crystal exposed to the sample.

A QCM-D (Quartz Crystal Microbalance with Dissipation monitoring) sensor is also available. The QCM-D sensor, in addition to providing the QCM functions, is capable of measuring a relationship between mass changes and viscoelasticity changes on the sensor surface based on the amount of frequency shift and amplitude dissipation shift of the quartz crystal.

On the surfaces of the QCM sensor and the QCM-D sensor, an electrode made of, for example, gold is provided. On the gold electrode, additional substances are formed, such as another metal, an oxide film, and a polymer film. For example, there is a hydroxyapatite (HA) sensor, which is formed by coating a particle film of hydroxyapatite ($Ca_{10}(PO_4)_6(OH)_2$: HA) on a gold electrode. Hydroxyapatite is a main inorganic component of biological bone and can be used as an artificial bone graft material. As such, a hydroxyapatite (HA) sensor is utilized as a simulated surface of artificial bones and teeth to replicate reactions of substances contained in biological fluids. In this manner, hydroxyapatite is applied in the development of medical materials such as bone regeneration promoters and in the development of oral care products such as stain removal agents for teeth.

There are techniques for forming a coating film on the surface of a substrate for medical materials such as artificial bones. For example, Patent Document 1 discloses a method of forming a bioabsorbable coating primarily made of an Mg-containing calcium phosphate film on the surface of a substrate made of magnesium or a magnesium alloy. Patent Document 2 discloses a medical device material including a plurality of calcium phosphate layers with different compositions on the surface of a substrate. The surface-side calcium phosphate layer is made of a material with a higher biodegradability, enabling the material to dissolve more readily in vivo and replace with bone tissue, as compared with the substrate-side calcium phosphate layer.

PRIOR ART DOCUMENTS

Patent Documents

Patent Document 1: JP2018-202074A.
Patent Document 2: JP2020-130766A.

DISCLOSURE OF THE INVENTION

Problem to be Solved by the Invention

From the viewpoint of crystal phase, calcium phosphate exhibits various crystal phases, and the crystal phases of the calcium phosphates recited in Patent Documents 1 and 2 are multiphase (for example, amorphous phase, HAp phase, OCP phase, etc.). A single-phase crystalline film of octacalcium phosphate (OCP), which is a type of calcium phosphate, has not yet been achieved.

Focusing on the crystalline layer, the coating film recited in Patent Document 1 is designed as a porous film to serve as a carrier for drugs. In Patent Document 2, the substrate side of calcium phosphate layer retains a rough surface structure, while the surface side of calcium phosphate layer forms a porous film. That is, both the calcium phosphate coating films formed on substrate surfaces by the film forming methods recited in Patent Documents 1 and 2 have multilayer structures with stacked crystals. Thus, deposition of a single-layer film where a single crystal exists in parallel as a single-layer structure, has not yet been achieved. Additionally, these calcium phosphate coating films have a μm-order surface roughness (unevenness), being poor in smoothness, and also have low adhesion properties with respect to the substrate. As a result, the calcium phosphate coating films have a problem of insufficient mechanical and chemical stability.

The conventional techniques also have such a problem that control over the exposure of crystal planes (orientation) in calcium phosphate crystals has not been achieved. In respect of octacalcium phosphate which has high biocompatibility and is used as a bone substitute in the fields of biotechnology and medicine, no technology has been developed to form a film of octacalcium phosphate, particularly to form stable thin films of octacalcium phosphate. Also, research in this area has made no progress to date.

Under these circumstances, the inventors of the present application focused on octacalcium phosphate, which is known for its high biocompatibility among known calcium phosphate ceramics, and conducted extensive studies. As a result, the inventors obtained the knowledge that a stable, single-layer crystalline film of octacalcium phosphate can be formed on a substrate surface.

The present invention has been made in light of the above-described problems, and has an object to provide a stable, single-layer crystalline film of octacalcium phosphate and a method of producing such crystalline film.

Means of Solving the Problem

To achieve the above-described object and address the above-described issues, the following configuration is provided as one means. A crystalline film according to the present invention includes a plate crystal of octacalcium phosphate arranged in a single-layer state, where the plate crystal has a longitudinal dimension with a distribution range of 50 nm to 10 μm, a transverse dimension with a distribution range of 5 nm to 1000 nm, and an aspect ratio of 2 to 100 obtained by dividing the longitudinal dimension by the transverse dimension.

For example, it is characterized in that a specific crystal plane of the plate crystal is oriented in a specific direction. For example, the specific direction is a surface direction of the crystalline film, and the specific crystal plane is preferentially exposed on a surface of the crystalline film over other crystal planes of the plate crystal excluding the specific crystal plane. For example, the crystalline film is formed on a surface of a conductive substrate. For another example, the conductive substrate is made of a conductive material selected at least from gold, titanium, chromium, and silicon. For example, the specific crystal plane is exposed in a thickness direction of the crystalline film and in a direction opposite to the conductive substrate. For further example, the crystalline film has a flat smoothness with an average root mean square roughness of 200 nm or less, preferably 100 nm or less, in a measurement range of 5 μm×5 μm on the surface of the crystalline film, and has a film thickness of 200 nm or less, preferably 50 nm or less. For example, the crystalline film has adhesion properties that the crystalline film does not detach from the conductive substrate even after being subjected to ultrasonic cleaning in ethanol at a frequency of 40 kHz for 1 minute. For further example, crystals in the crystalline film have a layered structure in which a hydrated layer and an apatite layer alternate repeatedly the hydrated layer being an uppermost layer exposed in the thickness direction of the crystalline film and in the direction opposite to the conductive substrate. For example, the specific crystal plane is a (100) plane.

A method of producing a crystalline film, according to the present invention, comprising the steps of synthesizing an octacalcium phosphate crystal (OCP crystal) by wet synthesis; preparing an ethanol dispersion of the OCP crystal; forming a multilayer deposited film of the OCP crystal on a cathode by electrophoresis in which the cathode is an electrode made of a conductive material selected at least from gold, titanium, chromium, and silicon; and performing ultrasonic cleaning of the multilayer deposited film to form a single-layer deposited film of the OCP crystal on the cathode.

In the method of producing the crystalline film, according to the present invention, for example, the single-layer deposited film is a crystalline film in which a (100) plane of the OCP crystal is oriented in a surface direction of the deposited film and preferentially exposed on a surface of the deposited film over other crystal planes of the OCP crystal excluding the (100) plane, the OCP crystal has a longitudinal dimension with a distribution range of 50 nm to 10 μm, a transverse dimension with a distribution range of 5 nm to 1000 nm, and an aspect ratio of 2 to 100 obtained by dividing the longitudinal dimension by the transverse dimension, and the single-layer deposited film is formed on a surface of a conductive substrate serving as the cathode, having a flat smoothness with an average root mean square roughness of 200 nm or less, preferably 100 nm or less, in a measurement range of 5 μm×5 μm on the surface of the deposited film, having a film thickness of 200 nm or less, preferably 50 nm or less, and having adhesion properties that the deposited film does not detach from the conductive substrate even after being subjected to ultrasonic cleaning in ethanol at a frequency of 40 kHz for 1 minute. Also, for example, crystals in the single-layer deposited film have a layered structure in which a hydrated layer and an apatite layer alternate repeatedly the hydrated layer being an uppermost layer exposed in a thickness direction of the single-layer deposited film and in the direction opposite to the conductive substrate. For example, an electrophoresis duration for forming the multilayer deposited film by the electrophoresis is at least 1 minute.

A QCM sensor according to the present invention is coated with the above-described crystalline film on a conductive substrate, wherein a (100) plane of a plate crystal of octacalcium phosphate constituting the crystalline film is preferentially exposed on a surface of the crystalline film over other crystal planes of the plate crystal excluding the (100) plane.

Effects of Invention

The technique of the present invention for forming a stable crystalline film of octacalcium phosphate on a substrate surface can be applied to surface coating technologies for medical instruments and devices in general.

BRIEF DESCRIPTION OF DRAWINGS

FIGS. 4A and 4B illustrate FE-SEM images of a plan view of a multilayer film of an octacalcium phosphate crystal;

FIGS. 5A and 5B illustrate FE-SEM images of residual particles in a residual solution;

DESCRIPTION OF EMBODIMENTS

An embodiment of the present invention will be described in detail below by referring to accompanying drawings and tables. In the embodiment described below, in a first step, processing such as synthesis of an octacalcium phosphate crystal was performed. In a second step, a multilayer deposited film (multilayer film) of the octacalcium phosphate crystal was formed on a substrate. In a third step, processing (single-layer film formation) of converting the multilayer film of the octacalcium phosphate crystal into a single-layer film was performed. Then, in a fourth step, an evaluation was performed as to sensing capability of a sensor on which the single-layer film was formed and as to reaction characteristics of the sensor in a biological fluid. It is to be noted that in the following description, octacalcium phosphate is abbreviated as OCP where appropriate.

In this description, the term "single-layer film" refers to such a film that a specific crystal plane of a plate crystal of OCP deposited on a substrate is arranged in parallel to the substrate and that the specific crystal plane is exposed to the outside in a layer direction without being covered by any other crystals on an outermost surface of the layer. A film having OCP plate crystals arranged in this manner will be referred to as a "single-layer" film.

On the other hand, the term "multilayer film" refers to such a film that plate crystals are stacked in multiple layers perpendicular to the substrate and that various crystal planes other than a specific crystal plane are exposed to the outermost surface, making the specific crystal plane unobservable on the outermost surface. Note that a crystalline film is more appropriately described as a single-layer film from a film thickness perspective, while being more appropriately described as a single-phase crystalline film from a crystal phase perspective.

<First Step>

Figure 1:
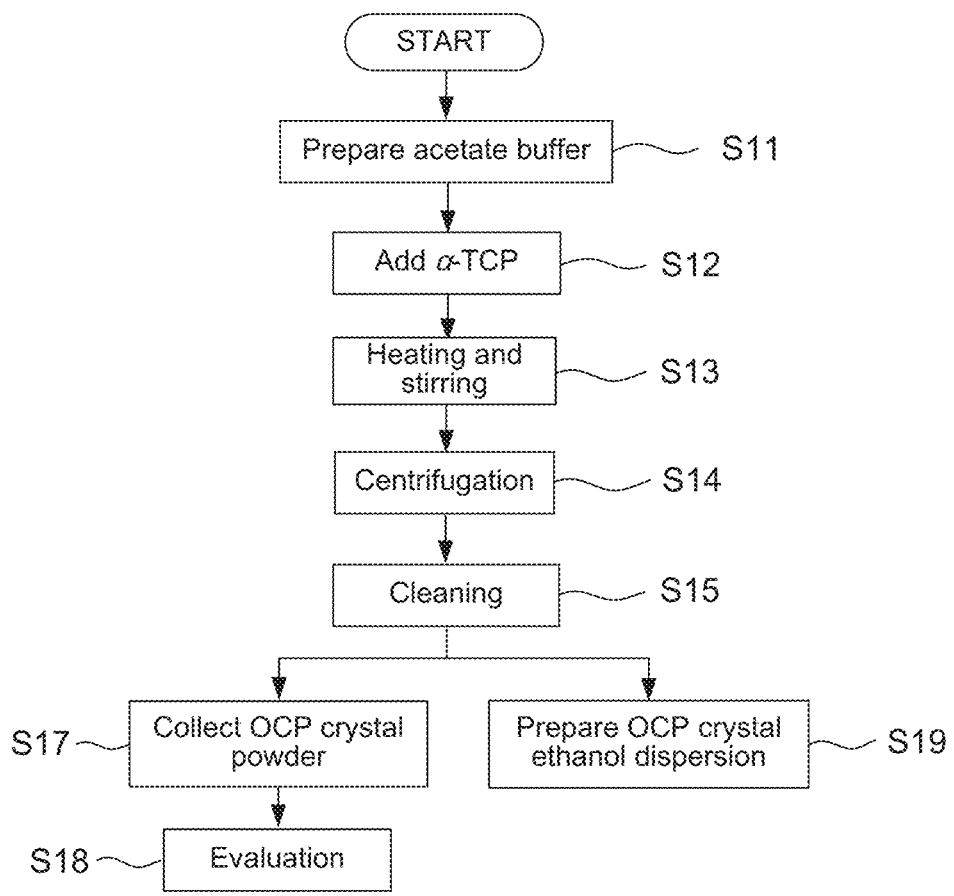
FIG. 1 is a flowchart illustrating a step of synthesizing an OCP crystal and adjusting a dispersion of the OCP crystal.

In this step, an octacalcium phosphate (OCP) crystal was synthesized by wet synthesis, and an OCP crystal dispersion was prepared. FIG. 1 is a flowchart illustrating a step of synthesizing an OCP crystal and adjusting a dispersion of the OCP crystal. In step S11 of FIG. 1, 25 ml of acetate buffer solution (acetate buffer) adjusted to a pH of 3.6 was prepared. In the next step S12, 0.6204 g of a-tricalcium phosphate (a-TCP: $Ca_3(PO_4)_2$) was added to the acetate buffer.

In step S13, the sample obtained at the above-described step was heated and stirred. Specifically, heating was performed at 60° C., and stirring was performed at 1200 revolutions per minute for three hours. In this heating and stirring step, a dissolving process of a-TCP is executed as represented by Equation (1), a transition process to OCP is executed as represented by Equation (2), and then a phase transition from a-TCP to OCP occurs, as represented by Reaction Equation (3).

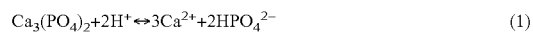

$$Ca_3(PO_4)_2 + 2H^+ \leftrightarrow 3Ca^{2+} + 2HPO_4^{2-} \qquad (1)$$

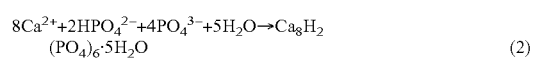

$$8Ca^{2+} + 2HPO_4^{2-} + 4PO_4^{3-} + 5H_2O \rightarrow Ca_8H_2(PO_4)_6 \cdot 5H_2O \qquad (2)$$

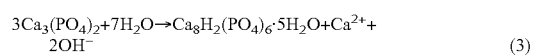

$$3Ca_3(PO_4)_2 + 7H_2O \rightarrow Ca_8H_2(PO_4)_6 \cdot 5H_2O + Ca^{2+} + 2OH^- \qquad (3)$$

In step S14, the heated and stirred sample was centrifuged. In step S15, the centrifuged sample was cleaned. Specifically cleaning with ultrapure water was performed once, and cleaning with ethanol was performed three times. In step S17, the sample cleaned as mentioned above was heated and dried (at 60° C. for 48 hours) to prepare and collect OCP crystal powder. The OCP crystal powder thus collected was evaluated in step S18. While, in step S19, the sample cleaned as mentioned above was dispersed in ethanol (2 wt %) to prepare an OCP crystal ethanol dispersion. The OCP crystal ethanol dispersion prepared here is used in film formation in the Second Step, described later.

Figure 2:
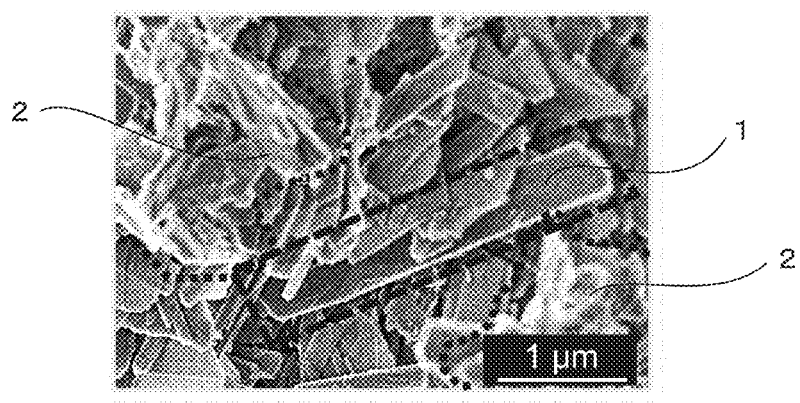
FIG. 2 illustrates an FE-SEM image of OCP crystal powder.

FIG. 2 illustrates, as the evaluation in step S18 of FIG. 1, an image of the OCP crystal powder prepared by heating and drying performed in step S17, captured using a field-emission scanning electron microscope (FE-SEM). As illustrated in FIG. 2, a mixture of a plate-like crystal 1 (surrounded by broken lines in FIG. 2) and an amorphous crystal 2 (surrounded by dotted lines in FIG. 2) is observed in the OCP crystal powder obtained by the above-described OCP crystal synthesis. The plate-like crystal 1 is subject to the film formation using the octacalcium phosphate crystal according to this embodiment.

<Second Step>

Figure 3:
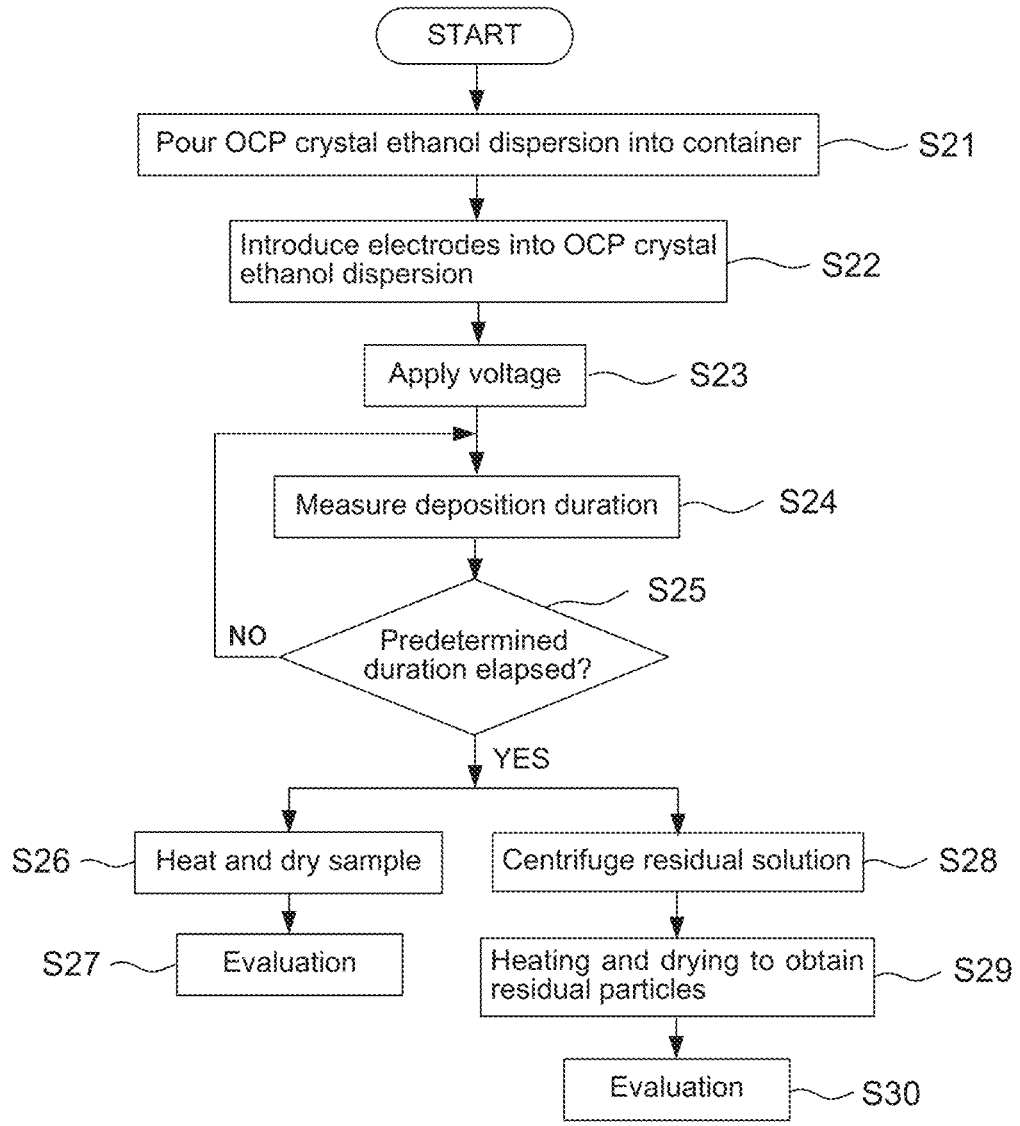
FIG. 3 is a flowchart illustrating a step of forming a deposited film by electrophoresis.
Figure 9:
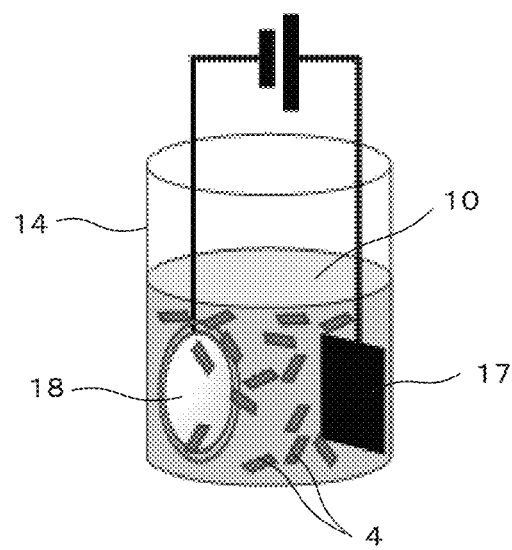
FIG. 9 illustrates a forming device for forming a deposited film by electrophoresis.

In this step, a deposited film (multilayer film) of an octacalcium phosphate crystal is formed by electrophoresis. FIG. 3 is a flowchart illustrating a step of forming a deposited film by electrophoresis. In step S3 of FIG. 21, 20 ml of a dispersion containing OCP particles 4, that is, an OCP crystal ethanol dispersion 10, which was prepared in the above-described First Step, was poured into a glass container 14, as illustrated in FIG. 9.

In step S22, an electrode 18 made of gold (also referred to as gold sensor) 18, which serves as a cathode, and a counter electrode 17, which serves as an anode, were introduced into the OCP crystal ethanol dispersion in the glass container 14, in which the gold sensor 18 and the counter electrode 17 were 1 cm apart from each other. Then, in step S23, a direct current of 100 V was applied between the anode and the cathode to cause the OCP particles 4 charged in the OCP crystal ethanol dispersion 10 to move under the influence of electric field and deposit onto the substrate (gold sensor).

It is to be noted that as the conductive material used for the cathode, a conductive substrate selected from titanium, chromium, and silicon can be used in addition to gold.

In the Second Step, in order to examine a relationship between the duration of the film deposition by electrophoresis and crystal morphology the film was formed by varying the duration of voltage application between the anode and the cathode. That is, in step S24 of FIG. 3, the duration of voltage application (deposition duration) was measured. In step S25, it was determined whether the application duration had reached a predetermined duration (determined whether intended deposition duration had elapsed). In this step, the duration of film deposition was set to five patterns: 1 minute, 2 minutes, 3 minutes, 4 minutes, and 5 minutes.

In step S26, the sample deposited on the gold sensor was heated and dried (at 60° C. for 48 hours). In the next step S27, the sample after heating and drying was evaluated. While, in step S28, the residual solution, from which deposition by electrophoresis could no longer occur, was centrifuged. In step S29, the resulting sample was heated and dried (at 60° C. for 48 hours) to obtain residual particles. Then, in step S30, the residual particles were evaluated.

FIGS. 4A and 4B show FE-SEM images the sample obtained in step S26 of FIG. 3, that is, the multilayer film of the octacalcium phosphate crystal deposited on the gold sensor by electrophoresis in planar views (viewed from a direction toward the gold sensor surface). FIGS. 5A and 5B show FE-SEM images of the residual particles in the residual solution obtained in step S29 of FIG. 3. FIG. 4B is an enlarged image of FIG. 4A, and FIG. 5B is an enlarged image of FIG. 5A.

The FE-SEM images illustrated in FIGS. 4A to 4B indicate that a multilayer film composed only of deposited plate-like octacalcium phosphate crystals, is formed on the gold sensor by electrophoresis. In FIG. 4B, a plate crystal which is particularly notable is surrounded by broken lines. In contrast, the FE-SEM images illustrated in FIGS. 5A to 5B indicate that the residual particles not deposited by electrophoresis are amorphous particles (that is, amorphous crystals). From these results, it has been found that only plate crystals can be selectively deposited onto the gold sensor by electrophoresis (in other words, the crystal morphology to be deposited can be selected).

Figure 6A:
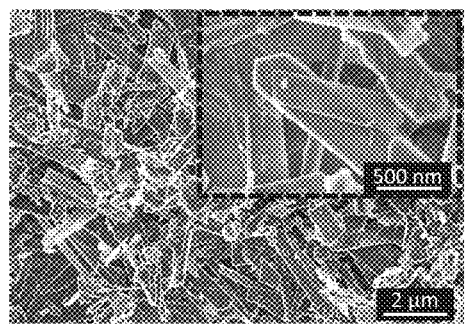
FIGS. 6A to 6E illustrate FE-SEM images illustrating a relationship between film deposition duration during electrophoresis and a plate crystal.
Figure 6B:
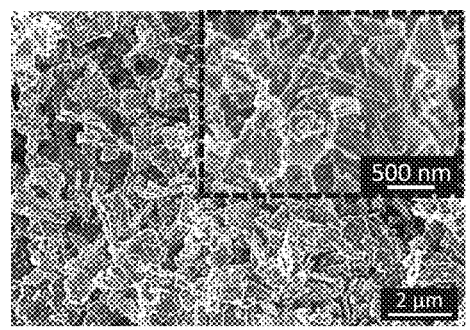
Figure 6C:
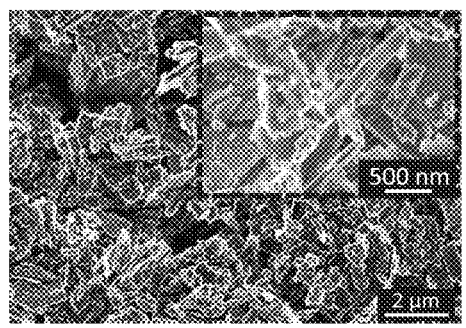
Figure 6D:
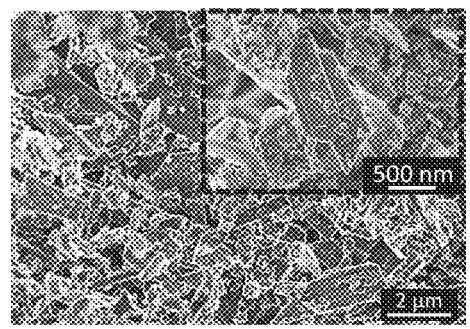
Figure 6E:
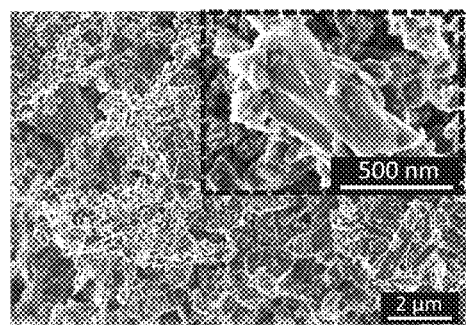

FIGS. 6A to 6E are FE-SEM images illustrating a relationship between film deposition duration by electrophoresis (also referred to as electrophoresis duration or voltage application duration) and a plate crystal. FIG. 6A illustrates an FE-SEM image in a case of 1 minute deposition duration, FIG. 6B illustrates an FE-SEM image of 2-minute deposition duration, FIG. 6C illustrates an FE-SEM image of 3-minute deposition duration, FIG. 6D illustrates an FE-SEM image of 4-minute deposition duration, and FIG. 6E illustrates an FE-SEM image of 5-minute deposition duration. In FIGS. 6A to CE, the image in the frame defined by broken lines is a partially enlarged image of each obtained image.

In these FE-SEM images, a plate crystal is observed at any of the deposition durations. Using image processing software called ImageJ, the presence ratio of plate crystals at each deposition duration was determined. The results showed that presence ratios of plate crystals was 80% for a deposition duration of 1 minute, 60% for 2 minutes, 55% for 3 minutes, 52% for 4 minutes, and 40% for 5 minutes. Thus, the presence ratio of plate crystals varies depending on the deposition duration. In light of this finding, the sample obtained with a deposition duration of 1 minute, in which an 80% presence ratio was achieved, was used for subsequent experiments and evaluations.

Figure 7:
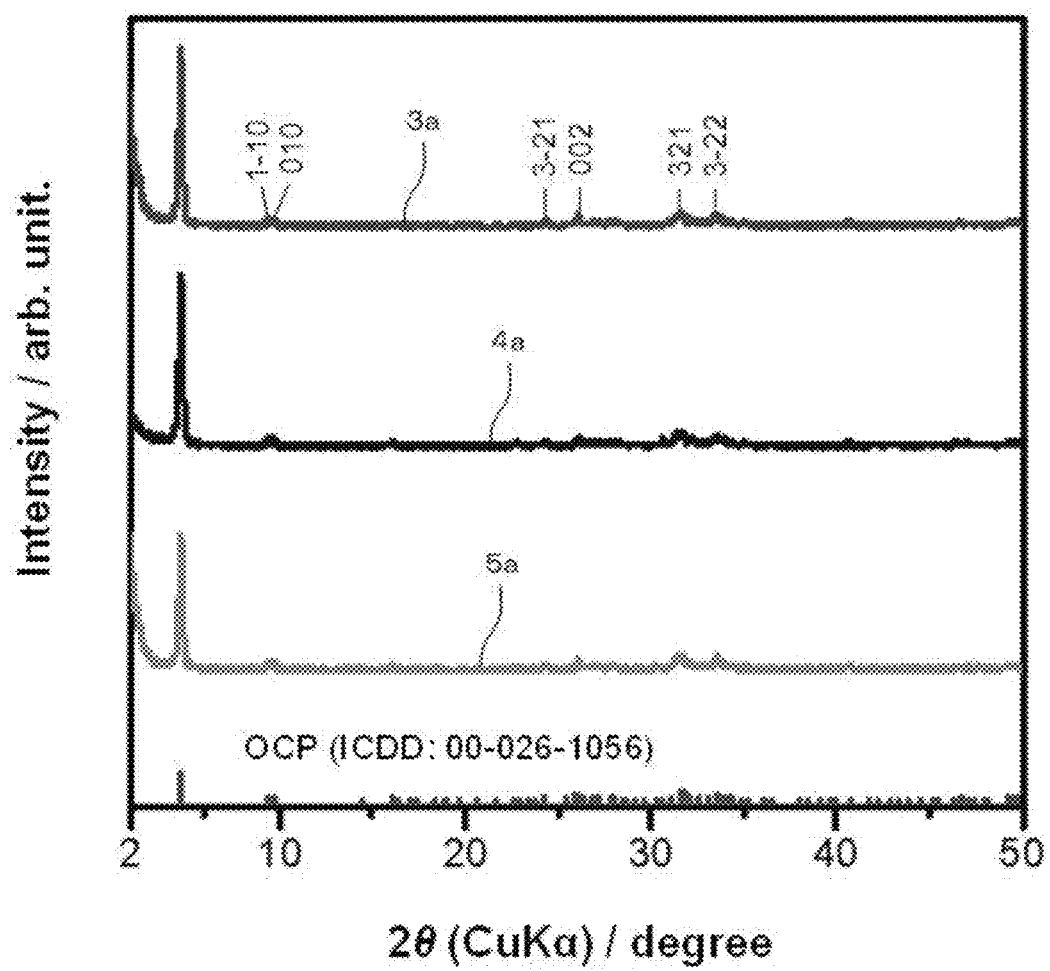
FIG. 7 illustrates a graph of a result of a comparison between X ray diffraction patterns (XRD patterns) of particles before and after deposition.

Next, differences in particles before and after the deposition of octacalcium phosphate crystals by electrophoresis will be described based on an analysis conducted from a different perspective than the above. FIG. 7 illustrates a result of a comparison between X ray diffraction patterns (XRD patterns) of particles before and after deposition. More specifically, in FIG. 7, the pattern indicated by reference numeral 3a is an XRD pattern of the OCP crystal powder as synthesized (the OCP crystal powder prepared in step S17 of FIG. 2), the pattern indicated by reference numeral 4a is an XRD pattern of the plate crystal (multilayer film crystal) deposited on the gold sensor by electrophoresis, and the pattern indicated by reference numeral 5a is an XRD pattern of an residual particle not deposited by electrophoresis.

Table 1 shows an example of crystallite size and degree of crystallinity in contrast for each of the particles (OCP crystal powder, deposited plate crystal, and residual particle) before and after deposition, indicated by XRD patterns in FIG. 7.

TABLE 1

|  | Crystallite size [nm] | Degree of crystallinity [%] |
| --- | --- | --- |
| OCP crystal powder | 27 | 97.6 |
| Deposited plate crystal | 34 | 96.6 |
| Residual particle | 26 | 97.4 |

The three XRD patterns of OCP crystal powder, deposited plate crystal, and residual particle illustrated in FIG. 7 show that the crystal phase remains identical before and after deposition and for the particle not deposited, with all exhibiting an OCP single-phase. Thus, the crystal phase of OCP particles remains unchanged before and after deposition. This indicates that the crystals are stable. FIG. 7 and Table 1 indicate that no significant difference exists in the degree of crystallinity among the particles before and after deposition (the degree of crystallinity is maintained). It is also observed that the crystallite size of the deposited plate crystal is larger than the crystallite size of other particles. These results indicate that electrophoresis causes crystals with larger crystallite sizes to be selectively deposited.

It is to be noted that the crystallite size was calculated using Equation (4) (Halder-Wagner formula). It is also to be noted that the degree of crystallinity was calculated using Equation (5) below.

[Equation 1]

$$\left(\frac{\beta}{\tan\theta}\right)^2 = \frac{K\lambda}{D}\frac{\beta}{\tan\theta\sin\theta} + 16\varepsilon^2 \quad (4)$$

In Equation (4), D represents crystallite size (nm), K denotes Scherrer constant, $\lambda$ represents X-ray wavelength (nm), $\varepsilon$ represents strain, $\beta$ represents broadening of diffraction line width (rad), and $\theta$ represents Bragg angle (rad). In this example, a diffraction peak near a diffraction angle of $2\theta=4°$ was used.

Degree of crystallinity=Area of crystalline peaks/
   Area of crystalline and amorphous peaks   (5)

Figure 8A:
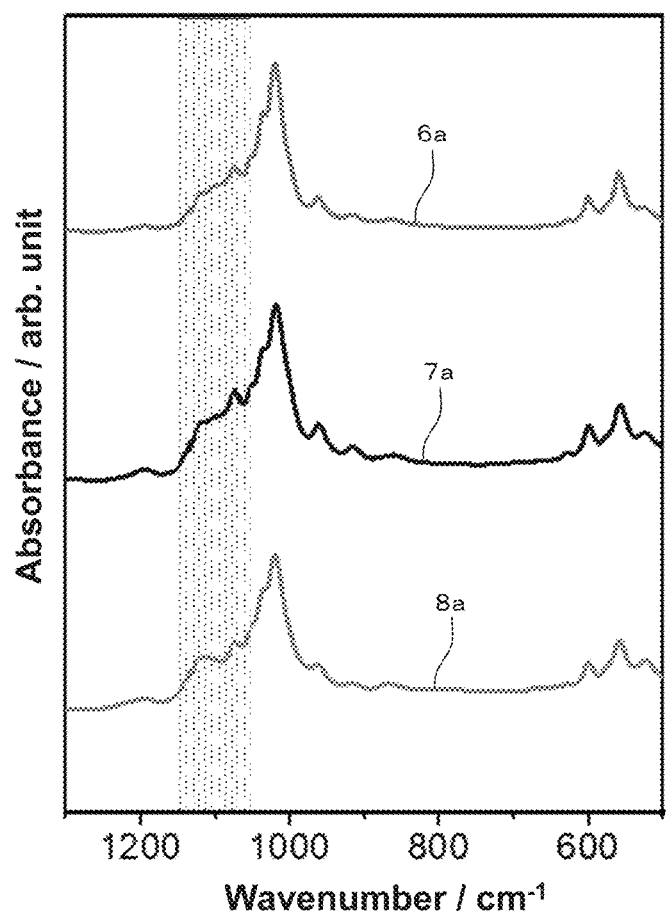
FIGS. 8A and 8B illustrate graphs showing ATR-FTIR spectra representing light absorption spectra on the surfaces of particles before and after deposition, measured by Fourier Transform Infrared (FTIR) Spectroscopy.
Figure 8B:
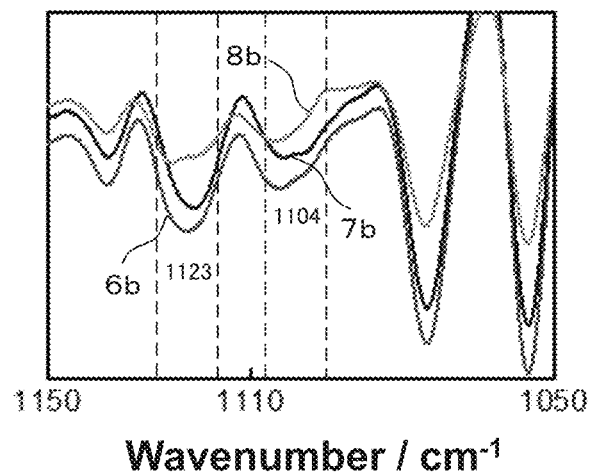

FIGS. 8A and 8B illustrate show ATR-FTIR spectra representing light absorption spectra on the surface of each particle (OCP crystal powder, deposited plate crystal, and residual particle) before and after deposition, measured by Fourier Transform Infrared (FTIR) Spectroscopy. FIG. 8A shows ATR-FTIR spectrum waveforms of the respective particles.

FIG. 8B illustrates second-derivative spectrum waveforms derived from the spectral shapes illustrated in FIG.

8A. In FIG. 8B, the second-derivative waveforms are depicted for the frequency (wavenumber) range of 1050 to 1150 $cm^{-1}$ (kaysers), indicated by the dashed line in FIG. 8A.

More specifically, in FIG. 8A, the second-derivative waveform of an ATR-FTIR spectrum waveform 6a of the OCP crystal powder as synthesized corresponds to waveform Gb in FIG. 8B. In FIG. 8A, the second-derivative waveform of an ATR-FTIR spectrum waveform 7a of the plate crystal deposited by electrophoresis corresponds to a waveform 7b in FIG. 8B. In FIG. 8A, the second-derivative waveform of an ATR-FTIR spectrum waveform 8a of the residual particle corresponds to a waveform 8b in FIG. 8B.

Focusing on the spectrum waveforms in FIG. 8B, it is observed that the second-derivative waveform 8b of the residual particle lacks peaks at wavenumbers 1123 $cm^{-1}$ and 1104 $cm^{-1}$, whereas these peaks are observed in the other waveforms (the second-derivative waveform Gb of the OCP crystal powder and the second-derivative waveform 7b of the deposition plate crystal). This indicates that the residual particles lack stretching vibration of hydrogen phosphate ions ($HPO_4^{2-}$) present at the boundaries between the hydrated layers and the apatite layers of octacalcium phosphate crystals having the layered structure in which the hydrated layers and the apatite layers alternate repeatedly.

This suggests that the residual particles, despite exhibiting crystallinity, have a disrupted layer structure, and only plate crystals with a layered structure are considered to have been deposited on the gold sensor.

Figure 10:
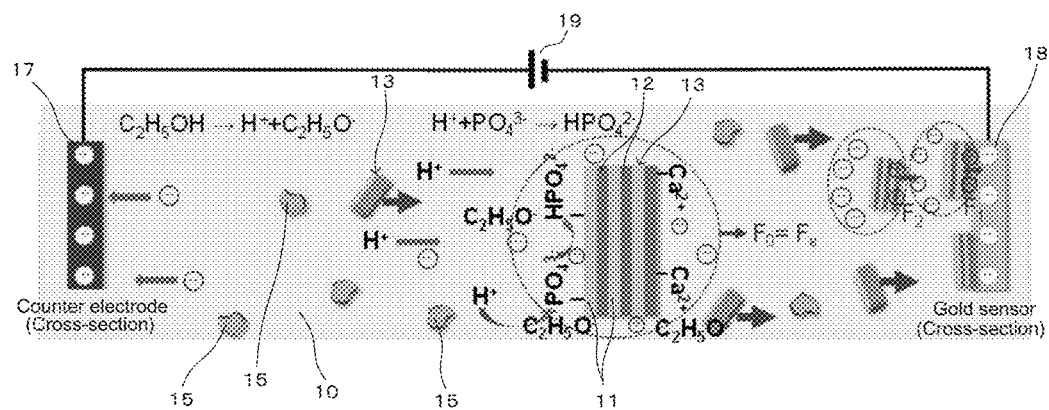
FIG. 10 schematically illustrates an electrophoretic deposition mechanism of OCP.

FIG. 10 schematically illustrates an electrophoretic deposition mechanism of OCP in the Second Step. As illustrated in FIG. 10, an ethanol dispersion 10 of OCP crystals as-synthesized contains a mixture of crystals 13 (plate crystals) having a regular layered structure and amorphous particles 15 with disrupted layer structure. The plate crystals 13 in which hydrated layers 11 and apatite layers 12 alternate repeatedly, have distinctive charging characteristics attributed to charge buildup in its hydrated layers 11. This causes migration of OCP particles during electrophoresis.

In FIG. 10, when a predetermined voltage is applied between the two electrodes (the counter electrode 17 and the gold sensor 18) connected to a DC power source 19, ethanol is electrolyzed into hydrogen ions and ethoxide ions ($C_2H_5O^-$). Then, the hydrated layers of the plate crystals 13 bind with the hydrogen ions, and as a result the entire crystals is charged positively (+). The remaining ethoxide ions ($C_2H_5O^-$) acquire a negative (−) charge, forming counter-ions, and an electrical double layer is formed with the positive and negative charges.

As a result, when it is possible to perform electrophoresis, positively (+) charged OCP particles move toward the cathode, where positively charged calcium ions predominantly present in the apatite layer and the negative of the gold sensor may interact to form plate crystal.

According to the DLVO theory, which explains dispersion and aggregation phenomena among charged particles, a potential energy curve (not shown) representing aggregation forces between particles indicates that the van der Waals force, which is an attractive force between particles, reach a maximum at a close interparticle distance (primary minimum). This observation indicates that, in the ethanol dispersion containing counterions illustrated in FIG. 10, the van der Waals force F increases in the order of $F_0$ (=electrophoretic force Fe)→$F_2$→$F_1$. That is, as the plate crystals approach the electrode (gold sensor 18), the plate crystals become increasingly stabilized.

<Third Step>

The deposited film of an octacalcium phosphate crystal formed in the above-described Second Step is a multilayer film. In light of this, in the Third Step, processing was performed to remove a surface layer of the multilayer film, leaving only a deeper layer on the gold sensor side. That is, in order to retain only the crystalline film firmly adhered to the substrate, processing of converting the octacalcium phosphate crystalline multilayer film into a single-layer film was performed.

Figure 11:
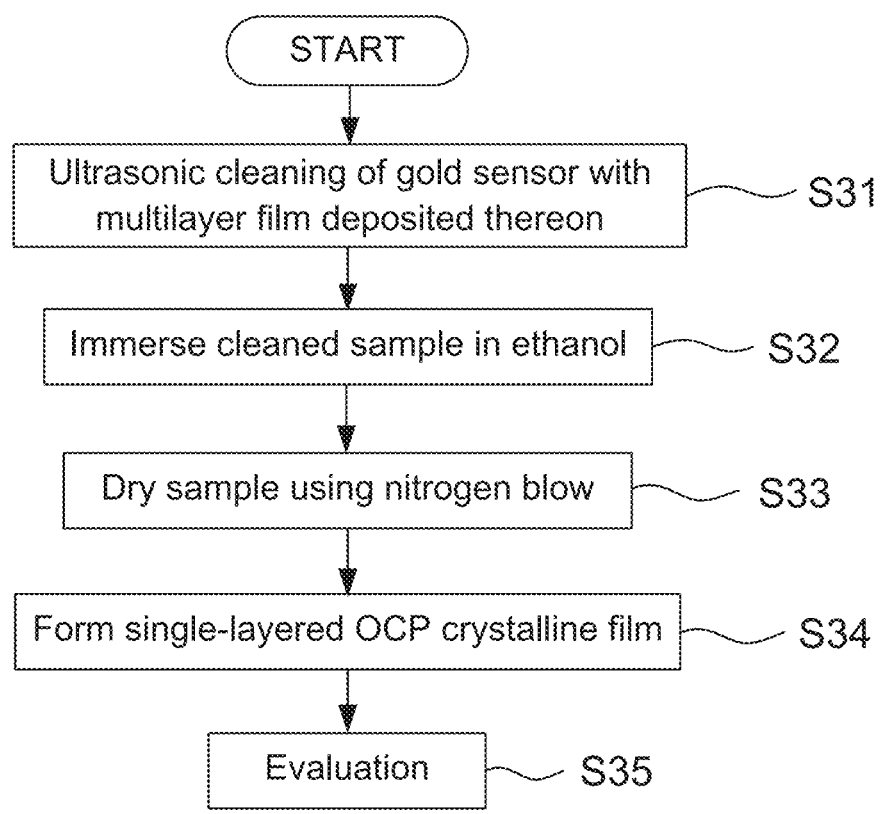
FIG. 11 is a flowchart illustrating processing of converting a multilayer film of an octacalcium phosphate crystal into a single-layer film.

FIG. 11 is a flowchart illustrating processing of converting a multilayer film of an octacalcium phosphate crystal into a single-layer film. At step S31 of FIG. 11, a gold sensor on which a multilayer film was deposited was subjected to ultrasonic cleaning. Here, pure ethanol was used as the cleaning solution, with a cleaning duration of one minute, an ultrasonic frequency of 40 kHz, and an ultrasonic power of 130 W. The gold sensor on which the octacalcium phosphate crystals had been deposited in the above-described Second Step was subjected to ultrasonic cleaning.

At step S32, the sample after cleaning was immersed in 20 ml ethanol. At next step S33, the sample was removed from ethanol and dried using a nitrogen blow. At step S34, a gold sensor on which a single-layer deposited film was adhered was formed; that is, an OCP crystalline film where the deposited film had been converted into a single layer was formed. Then, at step S35, the OCP crystalline film converted from a multilayer film to a single-layer film was evaluated.

Figures 12A, 12B, 12C, 12D:
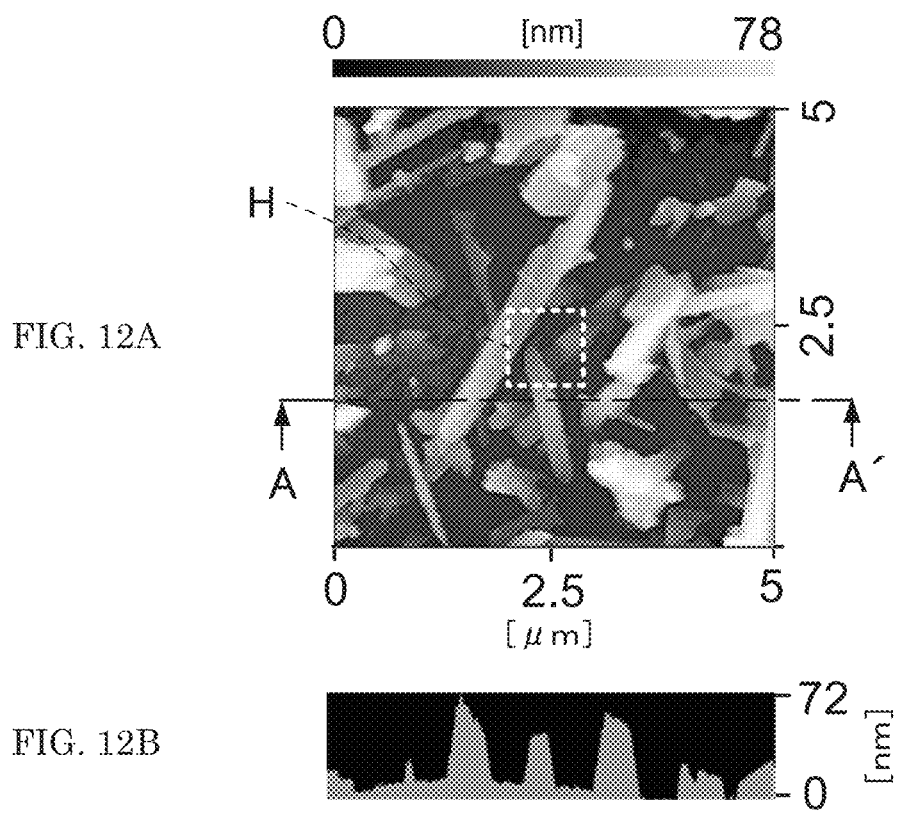
FIGS. 12A to 12D illustrate AFM images of the single-layer OCP crystalline film and its cross-section.

As described above, the single-layer film remained on the substrate even when ultrasonic cleaning was performed at a frequency of 40 kHz and an output of 130 W during the conversion from a multilayer to a single-layer. This finding indicates that the single-layer OCP film has strong adhesion properties to the substrate. Here, a surface measurement or the like were performed as evaluation of the single-layer OCP crystalline film. FIG. 12A is an AFM (atomic force microscopy) image of the single-layer OCP crystalline film formed in the Third Step. FIG. 12B is a cross-sectional view of the single-layer OCP crystalline film in FIG. 12A, cut along a line indicated by arrows A-A'.

Figure 13A:
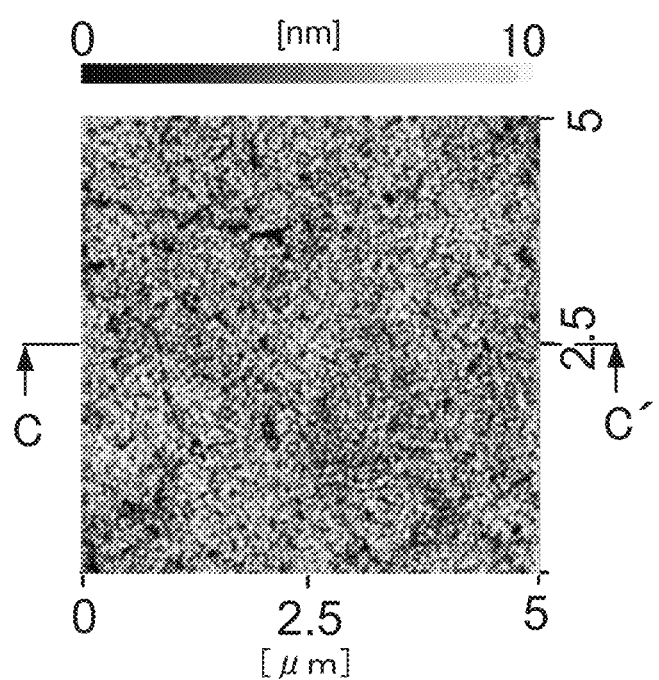
FIGS. 13A and 13B illustrate AFM images of a surface of a gold sensor without coating and a cross-section of the gold sensor surface.
Figure 13B:
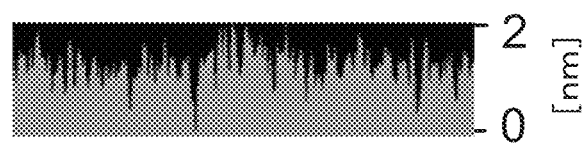

FIG. 12C is an enlarged AFM image of an H portion surrounded by dotted lines in FIG. 12A. FIG. 12D is a cross-sectional view of the single-layer OCP crystalline film in FIG. 12C, cut along a line indicated by arrows B-B'. FIG. 13A is an AFM image of a surface of a gold sensor without coating. FIG. 13B is a cross-sectional view of the gold sensor in FIG. 13A, cut along a line indicated by arrows C-C'.

Comparing the AFM images (FIGS. 13A and 13B) of the gold sensor without coating, the AFM images and the cross-sectional view in FIGS. 12A to 12D have shown that a single-layer deposited film was adhered on the gold sensor by performing the Third Step. It also has been found that as illustrated in FIG. 12C, the (100) plane of the OCP crystal was exposed (uncovered) outward in the layer direction.

Coverage rate of the single-layer OCP crystalline film formed in the Third Step was calculated using AFM analysis software. The coverage rate was in a range of 20% to 95%, and the average of it was calculated to be approximately 60% (the coverage rate of the uncoated gold sensor was 0%). The flat smoothness of the single-layer OCP crystalline film was measured with a surface measurement area of 5 μm×5 μm (corresponding to the range illustrated in the image in FIG. 12A). The flat smoothness is a surface irregularity (roughness), expressed as root mean square (Rms) roughness calculated from the AFM images. The obtained measurements showed that when the coverage rate was 35%, 46%, and 60%, the Rms values were 16 nm, 38 nm, and 43 nm, respectively. The root mean square (Rms) roughness measured over a 5 μm×5 μm area of the uncoated gold sensor substrate, which served as an underlying substrate, was found to be 2 nm or less. In comparison, the Rms roughness of the single-layer OCP crystalline film formed in the Third Step was higher than 2 nm, exhibiting a surface roughness approximately 20 times higher than the surface roughness of the gold sensor surface.

Note that the relationship between the coverage rate and the Rms roughness exhibits linearity based on measured values, considering potential overlap between the edges of plate crystals (the linearity is not illustrated). From this linearity, the Rms roughness at a coverage rate of 100% can be estimated to be approximately 71 nm.

As described above, the Rms value at a coverage rate of 60%, calculated from the AFM image, was 43 nm. Based on this result, a theoretical calculation of the Rms value at a coverage rate of 100% yields a value of 71 nm. The thickness of the OCP crystal illustrated in FIG. 12B is approximately 30 to 70 nm. Considering the thickness range (20 to 100 nm) of OCP crystals reported in other literature, if a maximum thickness of 100 nm is adopted, the Rms value could exceed the previously mentioned 71 nm. Accordingly, a preferred Rms value for the single-layer OCP crystalline film is set to 100 nm or less.

On the other hand, when the edges of OCP crystals overlap, the Rms value increases. For the same reason as the reason for defining the upper limit of the OCP crystalline film thickness as described later, if it is assumed to take twice the value of 100 nm with a consideration of a broader range, the upper limit of the Rms value is expected to be 200 nm.

Figure 14A:
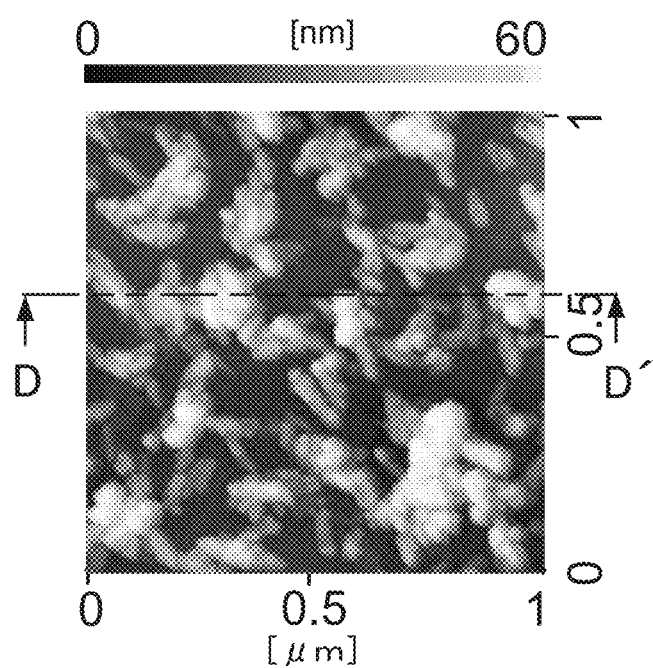
FIGS. 14A and 14B illustrate AFM images of a hydroxyapatite film and its cross-section.
Figure 14B:
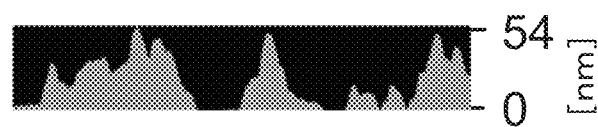

Furthermore, a comparison was made between the single-layer OCP crystalline film formed in the Third Step and a particle film of hydroxyapatite (HA) coated on the gold electrode of an HA sensor. FIG. 14A is an AFM image of the hydroxyapatite film. FIG. 14B is a cross-sectional view of the hydroxyapatite film in FIG. 14A, cut along a line indicated by arrows D-D'.

Figure 15A:
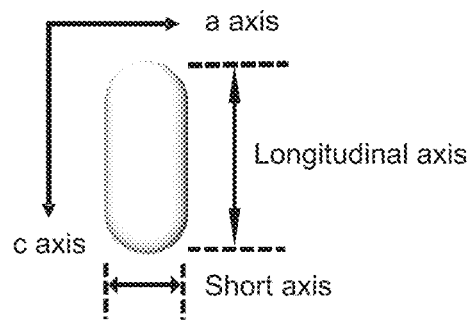
FIGS. 15A to 15C illustrate distributions of particle sizes of a crystal forming the hydroxyapatite film.
Figure 15B:
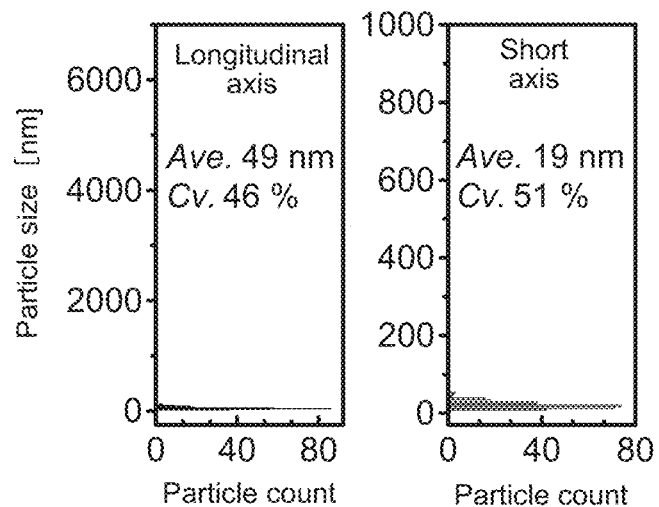
Figure 15C:
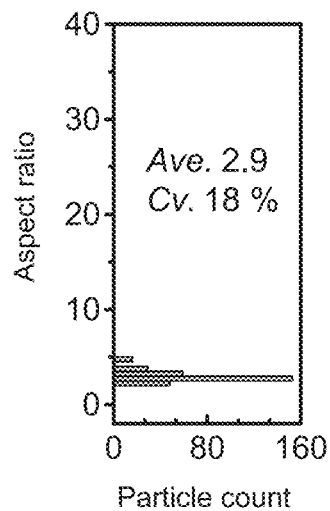

FIGS. 15B and 15C illustrate distributions of particle sizes of the hydroxyapatite film. In this example, a longitudinal axis (longitudinal dimension) and a short axis (transverse dimension) of the particle are defined as illustrated in FIG. 15A. Distributions of the longitudinal dimension and the transverse dimension, and an aspect ratio calculated by dividing the longitudinal dimension by the transverse dimension are illustrated in FIGS. 15B and 15C, respectively.

Figure 16A:
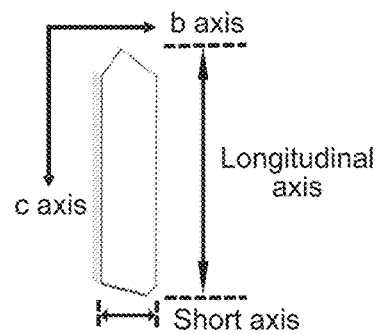
FIGS. 16 A to 16C illustrate distributions of particle sizes of a crystal that forms the single-layer OCP crystalline film.
Figure 16B:
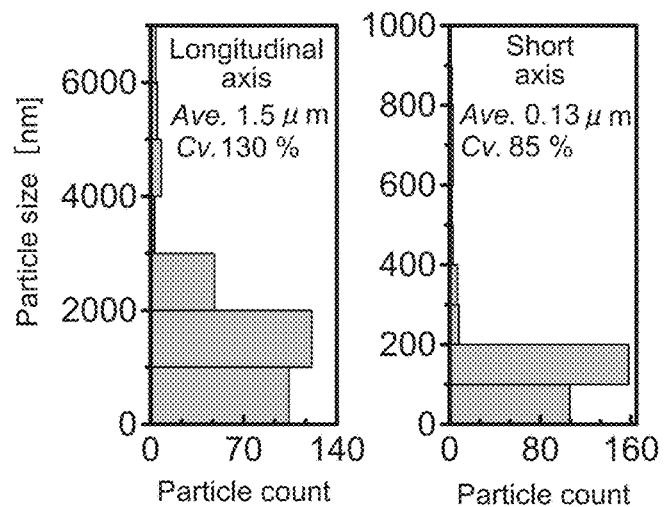
Figure 16C:
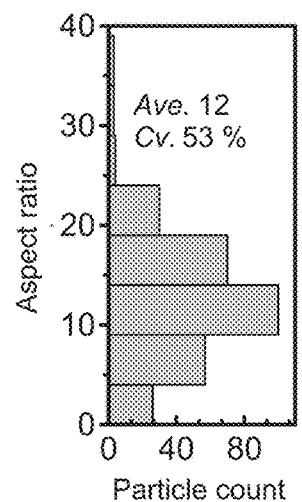

FIGS. 16B and 16C illustrate distributions of particle sizes of the single-layer OCP crystalline film. The longitudinal axis (longitudinal dimension) and the short axis (transverse dimension) of the particle are defined as illustrated in FIG. 16A. Distributions of the longitudinal dimension and the transverse dimension, and an aspect ratio calculated by dividing the longitudinal dimension by the transverse dimension are illustrated in FIGS. 16B and 16C, respectively.

Table 2 shows a comparison result between the hydroxyapatite film and the single-layer OCP crystalline film with respect to the distribution range of particle sizes, etc.

TABLE 2

| | Distribution range of longitudinal dimension [μm] | Distribution range of transverse dimension [nm] | Aspect ratio | QCM film thickness [nm] |
|---|---|---|---|---|
| Hydroxyapatite film | 0.01~0.4 | 2~80 | 1~10 | 5~15 |
| Single-layer OCP crystalline film | 0.05~10 | 5~1000 | 2~100 | 5~50 |

From the comparison results between the AFM image in FIG. 12C and that in FIG. 14A having the same magnification, and from a comparison between the crystal sizes (distribution ranges of longitudinal dimension and the transverse dimension) shown in Table 2, it has been found that the single-layer OCP crystalline film differs significantly from the hydroxyapatite film in crystal morphology and crystal size. It has also been found that there is a notable difference in film thickness between the single-layer OCP crystalline film and the hydroxyapatite film.

Furthermore, a significant difference in the aspect ratios of particle sizes was observed between the single-layer OCP crystalline film and the hydroxyapatite film, as shown in Table 2.

The film thickness of the single-layer OCP crystalline film is approximately 20 to 50 nm, as determined from the cross-sectional view of the AFM image as illustrated in FIG. 12D, for example. According to other literature, the thickness of OCP crystals is reported to range from approximately 20 to 100 nm. Considering the range reported in the literature, if 100 nm is adopted as the maximum thickness, an average film thickness is 100 nm in the case where the coverage rate of the single-layer OCP crystalline film reaches 100%. In contrast, when the edges of OCP crystals overlap in the crystalline film, the thickness doubles. Therefore, assuming a theoretical maximum of 100×2=200 nm, the film thickness is set to 200 nm or less in this example.

In contrast, the film thickness of the single-layer OCP crystalline film, as measured by QCM (QCM film thickness), was generally 50 nm or less. Accordingly, a preferred film thickness of the single-layer OCP crystalline film is set to 50 nm or less, as shown in Table 2.

Note that with respect to the single-layer OCP crystalline film, particles larger than particles obtained in actual experiments may be formed due to factors such as sample variability and experimental conditions. Therefore, during the synthesis of OCP particles, it is anticipated that the particle sizes may exceed the range illustrated in FIG. 16B. In light of this, a distribution range for the longitudinal dimension of the single-layer OCP crystalline film shown in Table 2 is a range that is assumed to exceed the particle sizes illustrated in FIG. 16B. The same applies to the aspect ratios illustrated in Table 2.

Evaluation of the single-layer OCP crystalline film formed in the Third Step was performed using the above-described AFM images. In addition to this evaluation, surface measurements of the crystal were performed using ATR-FTIR and X-ray photoelectron spectroscopy (XPS). These were employed as the methods to highlight characteristics of single-layer films, that is, differences from characteristics of multilayer films.

In the analysis of multilayer films using ATR-FTIR, the penetration depth of infrared radiation into the crystals ranges from 0.5 to 2 μm. Accordingly, both an interaction between OCP crystals and a bond within individual OCP crystals are observed. In contrast, in the analysis of the single-layer films using ATR-FTIR, interaction between OCP crystals was eliminated. This allows functional groups originating solely from individual OCP crystals to be detected, enabling observation of only bonds within individual OCP crystals in the single-layer film.

Figure 17:
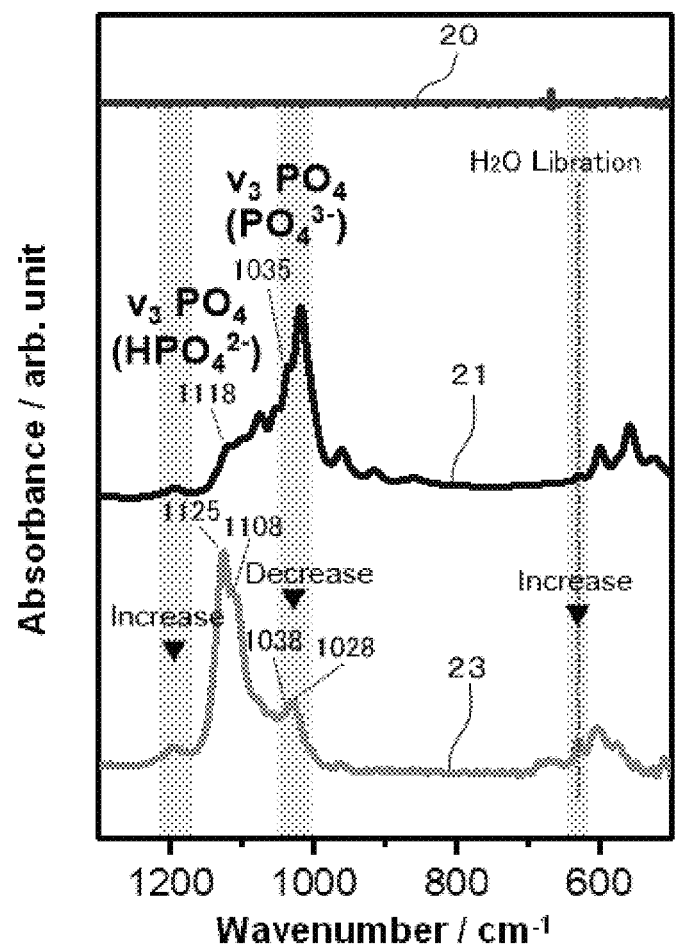
FIG. 17 illustrates a graph of spectrum waveforms, measured by ATR-FTIR, of the multilayer film and the single-layer OCP crystalline film before undergoing ultrasonic cleaning.

FIG. 17 illustrates a graph of spectrum waveforms, measured by ATR-FTIR, of the multilayer film and the single-layer OCP crystalline film before undergoing ultrasonic cleaning. As illustrated in FIG. 17, there is a clear difference in shape between an ATR-FTIR spectrum waveform 21 of the multilayer film and an ATR-FTIR spectrum waveform 23 of the single-layer OCP crystalline film. Note that a waveform 20 is an ATR-FTIR spectrum waveform of the gold sensor.

Focusing on the changes in the ATR-FTIR spectrum waveform 23 of the single-layer OCP crystalline film illustrated in FIG. 17, light absorption intensity increases at wavenumbers of 1195 cm$^{-1}$ and 628 cm$^{-1}$, and decreases at a wavenumber of 1035 cm$^{-1}$. The increase at the wavenumbers of 1195 cm$^{-1}$ and the increase at the wavenumber of 628 cm$^{-1}$ respectively indicate an increase in hydrogen phosphate ions ($HPO_4^{2-}$) and an increase in $H_2O$ absorption present in the hydrated layers of the OCP crystalline film. The decrease at the wavenumber of 1035 cm$^{-1}$ is attributed to a decrease in phosphate ion ($PO_4^{3-}$) absorption.

Thus, it has been found that due to the increases in light absorption intensity at the wavenumbers of 1195 cm$^{-1}$ and 628 cm$^{-1}$, hydrated layers increased throughout the single-layer OCP crystalline film. Also, from the fact that the decrease in light absorption intensity at the wavenumber of 1035 cm$^{-1}$ was attributed to the reduction in $PO_4^{3-}$ absorption associated with the apatite layers, it has been found that in the overall structure of the single-layer OCP crystalline film, hydrated structures are reinforced compared with apatite layers.

Upon further examination of the spectrum waveform illustrated in FIG. 17, the ATR-FTIR spectrum waveform 23 of the single-layer OCP crystalline film exhibits peak splitting at a wavenumber of 1118 cm$^{-1}$ into 1125 cm$^{-1}$ and 1108 cm$^{-1}$, and peak splitting at a wavenumber of 1035 cm$^{-1}$ into 1038 cm$^{-1}$ and 1028 cm$^{-1}$. Such peak splitting results from the single-layer formation of the OCP crystalline film, meaning that the formed single-layer OCP crystalline film possesses high crystallinity and a well-established hydrated layer.

Figure 18:
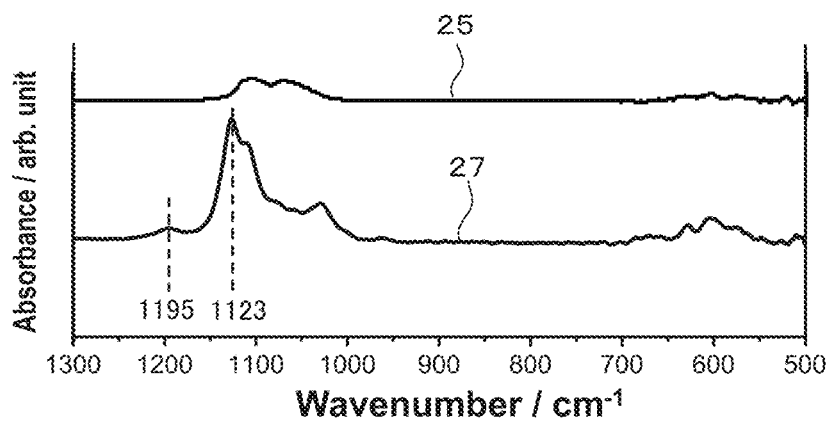
FIG. 18 illustrates a graph of a comparison between an ATR-FTIR spectrum waveform of the single-layer OCP crystalline film and an ATR-FTIR spectrum waveform of the hydroxyapatite film.

Note that FIG. 18 illustrates an ATR-FTIR spectrum waveform of the single-layer OCP crystalline film according to this embodiment and an ATR-FTIR spectrum waveform of the hydroxyapatite film in comparison. As illustrated in FIG. 18, a spectrum waveform 27 of the single-layer OCP crystalline film exhibits two peaks (significant absorption points of light) at 1195 cm$^{-1}$ and 1123 cm$^{-1}$. These two peaks are not observed in a spectrum waveform 25 of the hydroxyapatite film.

These two peaks indicate that hydrated layers are definitively formed in the single-layer OCP crystalline film. Accordingly, the presence or absence of these peaks in the spectrum waveforms enables to readily distinguish between the single-layer OCP crystalline film and the hydroxyapatite film.

Next, results of measuring crystal surfaces using X-ray photoelectron spectroscopy (XPS) will be described. In this measuring, narrow-scan analysis was employed to examine the energy range of particular elements.

Figure 19:
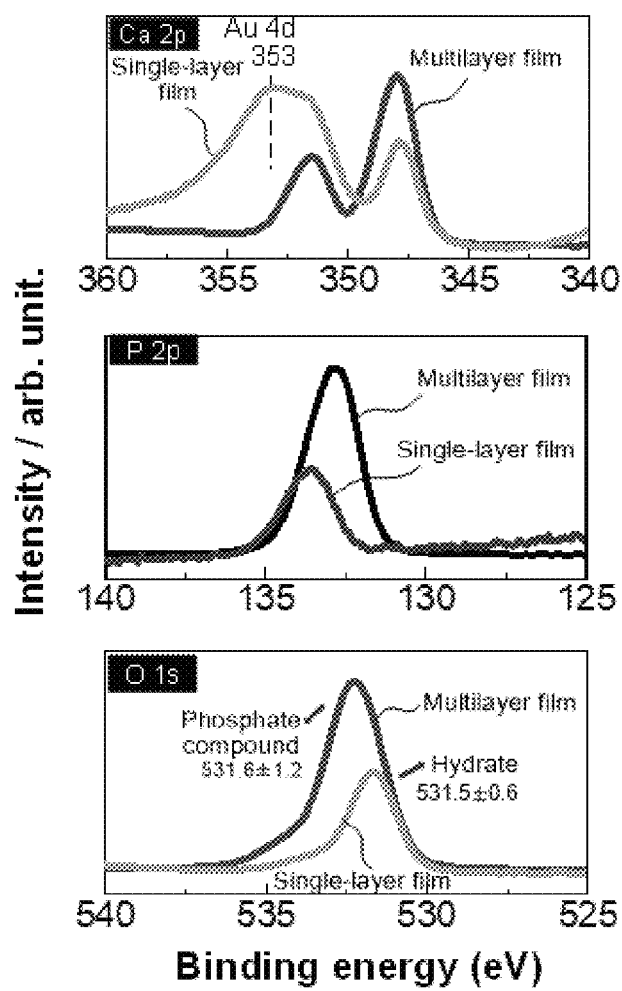
FIG. 19 illustrates graphs of results of XPS analysis for calcium (Ca), phosphorus (P), and oxygen (O) corresponding to the multilayer film and the single-layer OCP crystalline film.

FIG. 19 illustrates results of XPS analysis of the multilayer film and the single-layer film (the single-layer OCP crystalline film according to this embodiment) for elements: calcium (Ca), phosphorus (P), and oxygen (O). FIG. 19 reveals that differences exist in the waveform profiles and photoelectron emission intensities between the multilayer film and the single-layer film for the respective elements.

Figure 20A:
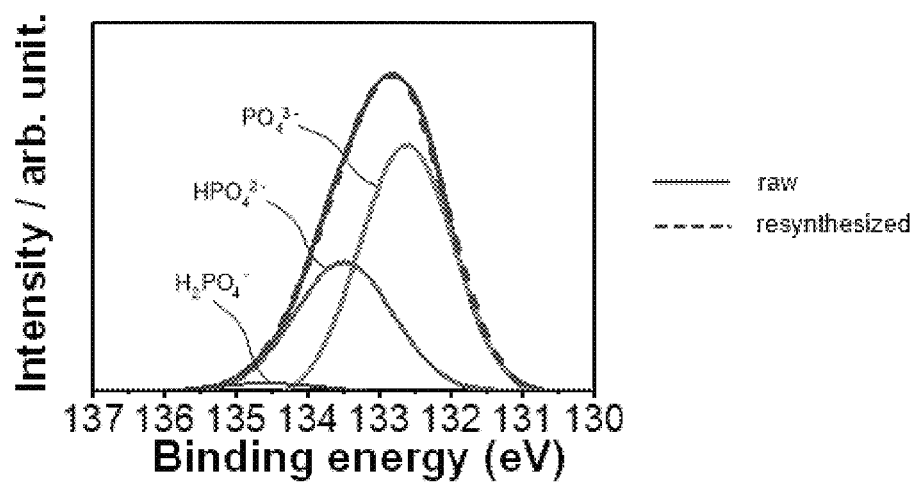
FIGS. 20A and 20B illustrate graphs of results of spectrum deconvolution for phosphorus (P) from FIG. 19.
Figure 20B:
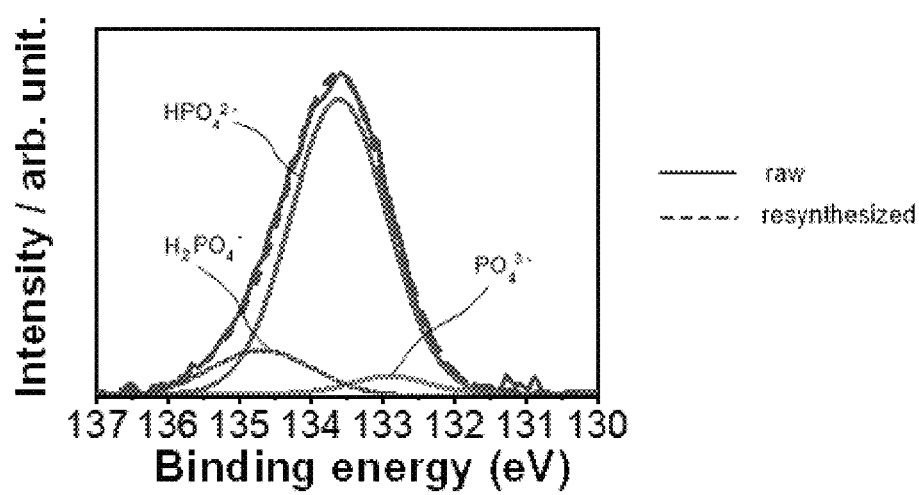

FIGS. 20A and 20B illustrate results of spectrum deconvolution performed for phosphorus (P) illustrated in FIG. 19. FIG. 20A illustrates results of peak separation for phosphorus (P) corresponding to the multilayer film, and FIG. 20B illustrates results of peak separation for phosphorus (P) corresponding to the single-layer film. Table 3 below shows ion ratios observed in the multilayer film and the single-layer film.

TABLE 3

|  | $PO_4^{3-}$ [%] | $HPO_4^{2-}$ [%] | $H_2PO_4^{-}$ [%] |
|---|---|---|---|
| Multilayer film | 63 | 33 | 4 |
| Single-layer film | 4 | 83 | 13 |

In XPS analysis, the escape depth of photoelectrons ranges from 2 to 6 nm, enabling the detection of chemical states at the outermost surface of the film. FIG. 20B and Table show that the proportion of hydrogen phosphate ions ($HPO_4^{2-}$) attributed to the hydrated layer increases in the single-layer OCP crystalline film according to this embodiment. This may suggest that the hydrated layer is exposed at the outermost surface of the single-layer film.

Accordingly, an OCP crystalline film is formed on the surface of the substrate (gold sensor), where the multilayer film has been converted into the single-layer film. This OCP crystalline film has a layered structure in which a hydrated layer is formed on a surface in the thickness direction of the film and opposite to the substrate, and constitutes the uppermost layer, where hydrated layers and apatite layers alternate in a regular pattern. In other words, the crystalline structure of the single-layer film formed through the single layer formation has a layered configuration.

<Fourth Step>

In this step, the sensor on which the single-layer film was formed through the First to Third Steps was evaluated in terms of sensing capability and reaction characteristics in a biological fluid environment. More specifically, behavior of the single-layer OCP film deposited on the substrate (gold sensor) in a phosphate-buffered saline (PBS) solution was evaluated.

Figure 21:
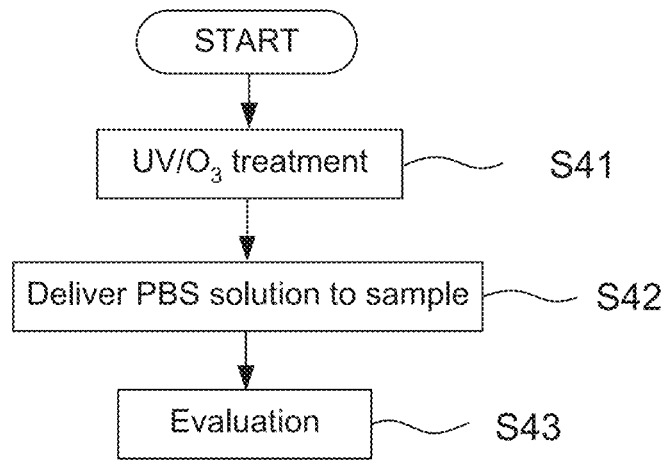
FIG. 21 is a flowchart illustrating processing of evaluating behavior of the single-layer OCP film in a case that a PBS solution is poured for a predetermined duration of time.

FIG. 21 is a flowchart illustrating processing of evaluating behavior of the single-layer OCP film in a case where a PBS solution is poured (delivered) for a predetermined duration of time. At step S41 of FIG. 21, ozone cleaning (UV/$O_3$) using ultraviolet irradiation was performed for five minutes on a sample under evaluation (single-layer OCP film). In this manner, organic contaminants and other impurities were removed from the sample.

At next step S42, a PBS solution was delivered to the single-layer OCP film. Here, a delivery rate of 77 ml per minute was maintained at 37° C. The PBS solution used had a pH of 7.4±0.2 and a composition of 1370 mmol/l of NaCl, 81 mmol/l of $Na_2HPO_4$, 26.8 mmol/l of KCl, and 14.7 mmol/l of $KH_2PO_4$.

Figure 22:
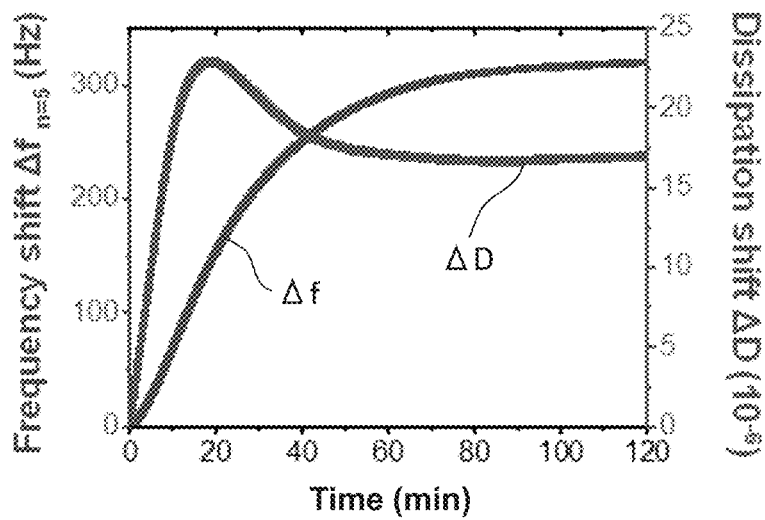
FIG. 22 illustrates a graph of weight changes and other characteristics of the single-layer OCP film in the PBS solution.

At step S43, behavior in the PBS solution was evaluated using QCM-D. FIG. 22 illustrates weight changes etc., of the single-layer OCP film in the PBS solution. The scale on the left vertical axis in FIG. 22 represents the amount of frequency shift Δf of a quartz crystal, and the scale on the right vertical axis represents amplitude dissipation shift ΔD. Overtone number n used in the evaluation was n=5.

In FIG. 22, on the scale on the left vertical axis, the direction from bottom to top corresponds to a decrease in weight. Therefore, a change in Δf caused by the PBS solution, that is, the fact that the single-layer OCP film gradually dissolves and detaches to decrease in weight over time suggests that the single-layer OCP film exhibits high reactivity in the PBS solution. A change in ΔD as illustrated in FIG. 22, namely, dissipation of resonance energy of the single-layer OCP film was also observed.

Figure 23:
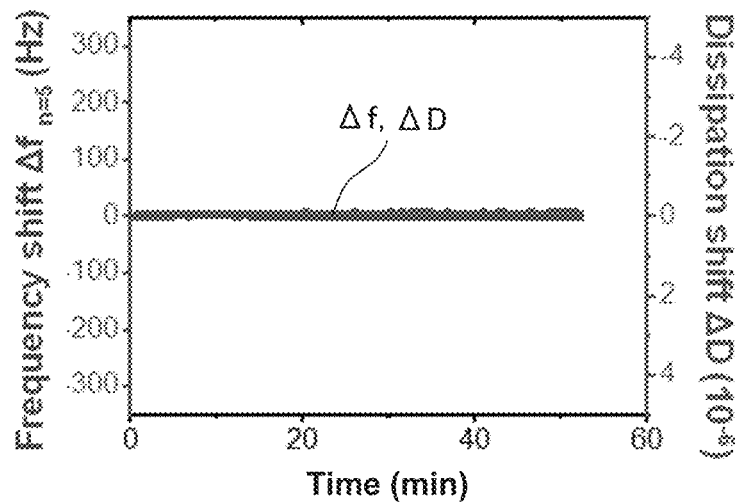
FIG. 23 illustrates a graph of weight changes and other characteristics of the hydroxyapatite film in the PBS solution.

FIG. 23 illustrates weight changes over time of the hydroxyapatite film in the PBS solution etc. As illustrated in FIG. 23, the hydroxyapatite film exhibited no changes in Δf and ΔD. Comparing with FIG. 22, it has been found that the single-layer OCP film demonstrated a behavior in the PBS solution significantly different from the behavior of the hydroxyapatite film, and exhibited bioactivity superior than the hydroxyapatite film.

Figure 24:
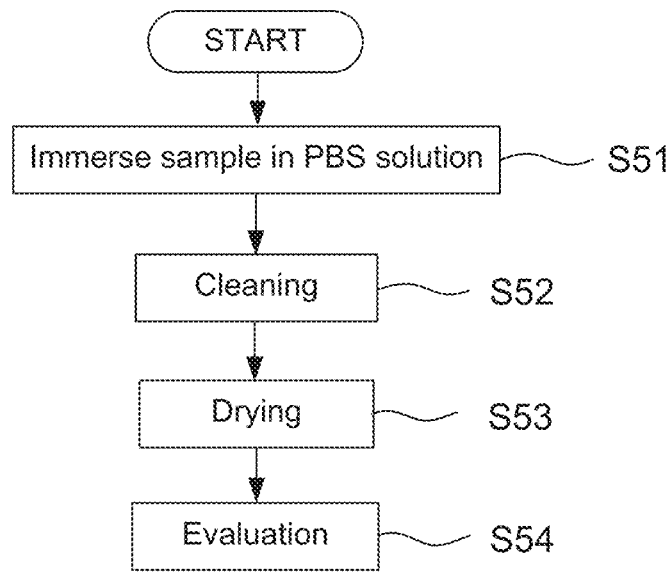
FIG. 24 is a flowchart illustrating processing of evaluating the behavior of the single-layer OCP film in a case that the single-layer OCP film is immersed in the PBS solution.

FIG. 24 is a flowchart illustrating processing of evaluating the behavior of the single-layer OCP film in a case where the single-layer OCP film deposited on the substrate (gold sensor) is immersed in the PBS solution. At step S51 of FIG. 24, a sample under evaluation (single-layer OCP film) was immersed in the PBS solution. Here, the immersion was performed at 37° C. in 3 ml of PBS solution for durations of 0 minutes, 5 minutes, and 120 minutes, respectively.

At step S52, the immersed sample was cleaned once with ultrapure water and once with ethanol. At next step S53, the sample after cleaning was dried at 60° C. for 24 hours. Then, at step S54, QCM-based weight measurements were performed as an evaluation of behavior of the single-layer OCP film during PBS solution immersion.

Figure 25:
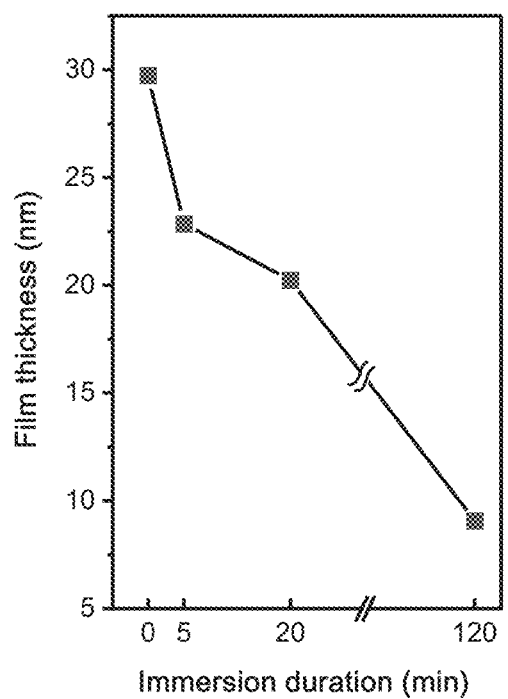
FIG. 25 illustrates a graph of film thickness changes of the single-layer OCP film relative to immersion duration in the PBS solution.
Figure 26:
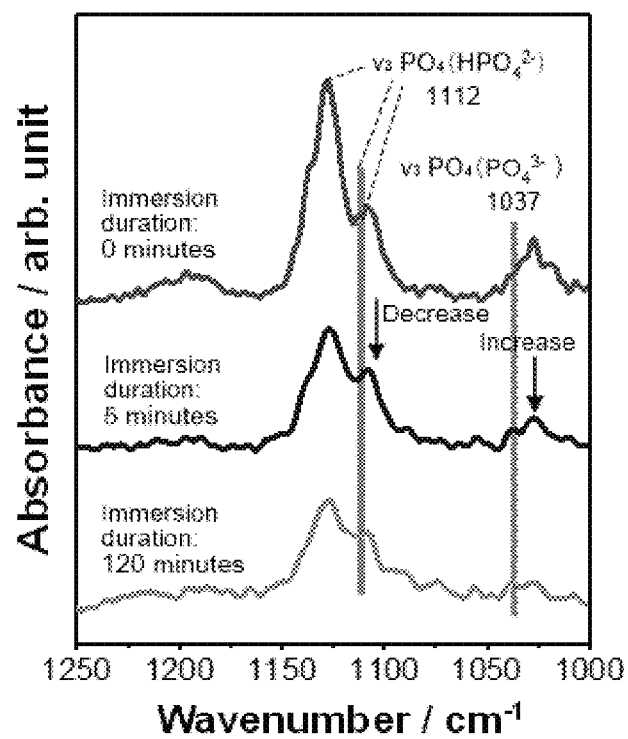
FIG. 26 illustrates a graph of spectrum waveforms, measured by ATR-FTIR, of the single-layer OCP crystalline film relative to the immersion duration in the PBS solution.

FIG. 25 illustrates film thickness changes of the single-layer OCP film relative to immersion duration in the PBS solution. FIG. 26 illustrates spectrum waveforms of the single-layer OCP crystalline film measured by ATR-FTIR for each of the immersion durations in the PBS solution: 0 minutes, 5 minutes, and 120 minutes.

FIG. 25 shows that in the PBS solution, the single-layer OCP film gradually dissolves and detaches over immersion time, resulting in a gradual decrease in film thickness.

Based on the spectrum waveform in FIG. 26, it is observed that a light absorption intensity in the single-layer OCP crystalline film decreases as the immersion duration in the PBS solution increases. From this finding, dissolution of the crystal was confirmed.

Additionally, the light absorption intensity decreases at a wavenumber of 1112 cm$^{-1}$ and increases at a wavenumber of 1037 cm$^{-1}$. The decrease at a wavenumber of wavenumber 1112 cm$^{-1}$ indicates a decrease in the hydrogen phosphate ions ($HPO_4^{2-}$) present in the hydrated layers of the OCP crystalline film. The increase at a wavenumber of 1037 cm$^{-1}$ originates from an enhancement in the absorption of phosphate ions ($PO_4^{3-}$) present in the apatite layer of the OCP crystalline film. This suggests that the dissolution from the hydrated layer during the immersion process leads to a relative increase in the apatite layer.

Figure 27:
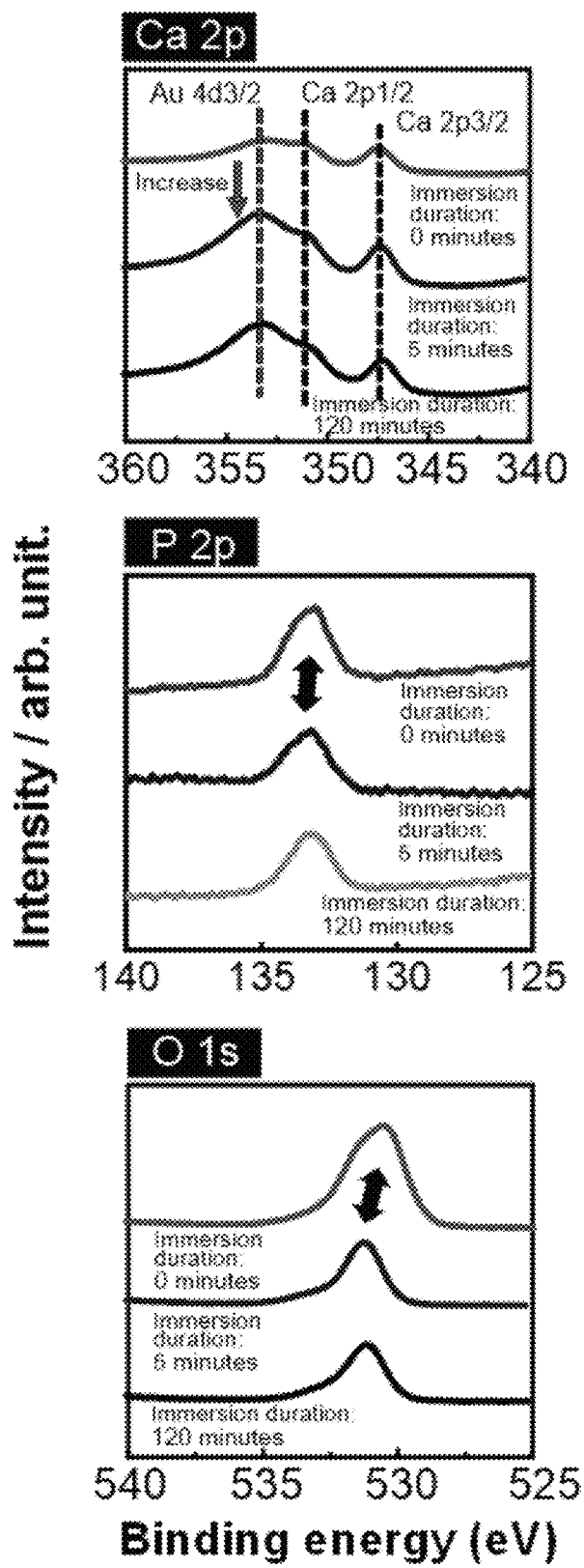
FIG. 27 illustrates graphs of results of XPS analysis of Ca, P, and O before and after the single-layer OCP film is immersed in the PBS solution.
Figure 28A:
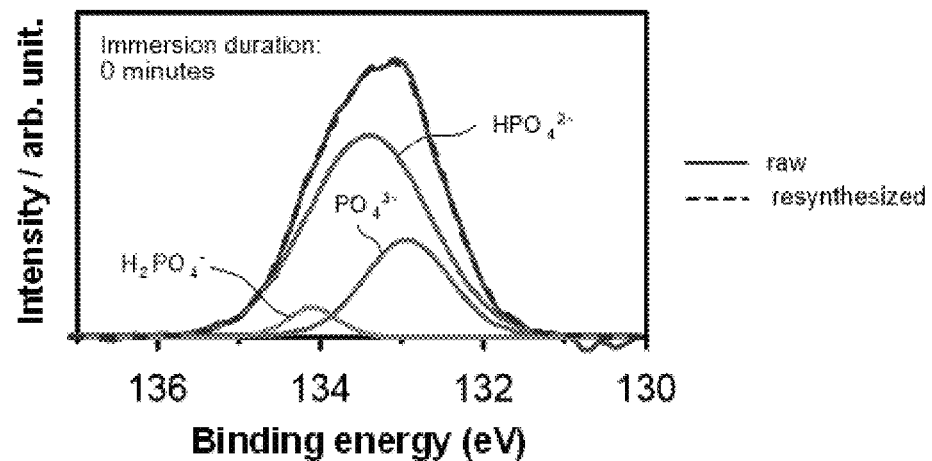
FIGS. 28A to 28C illustrate graphs of results of spectrum deconvolution of phosphorus (P) shown in FIG. 27.
Figure 28B:
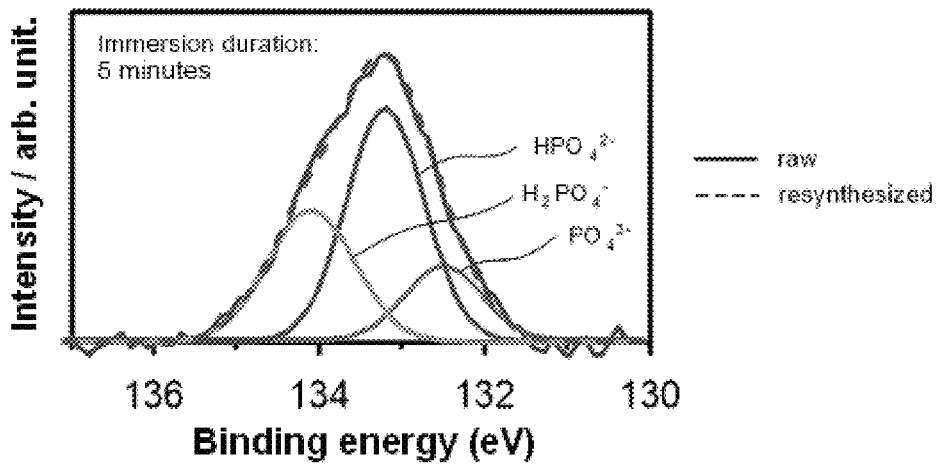
Figure 28C:
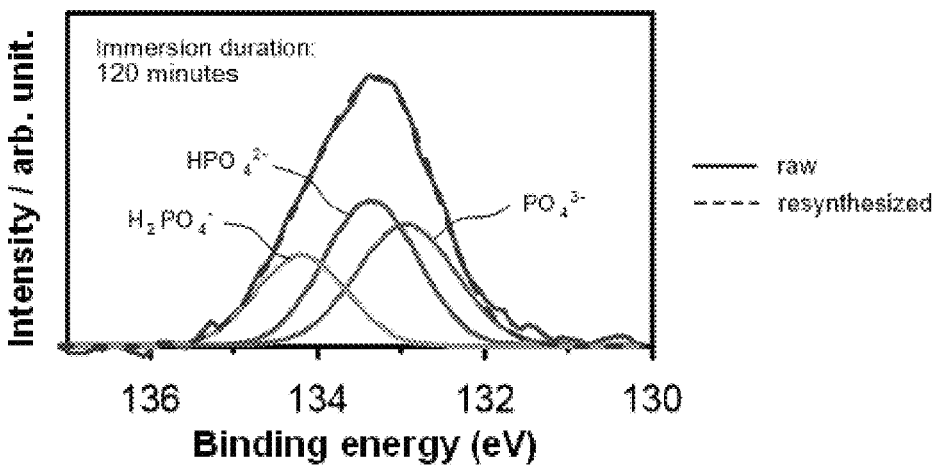

FIG. 27 illustrates results of XPS analysis of the single-layer OCP film before and after immersion in the PBS solution for elements: calcium (Ca), phosphorus (P), and oxygen (O). FIG. 27 shows that as for phosphorus (P), there are differences in the waveform profile and photoelectron emission intensity due to immersions. FIGS. 28A to 28C illustrate results of spectrum deconvolution for phosphorus (P) shown in FIG. 27. As illustrated in FIGS. 28A and 28B, immersion for five minutes resulted in a decrease in $HPO_4^{2-}$ and an increase in $H_2PO_4^-$ component.

When considering based on the above results, the reason for the increase in the ΔD value of the single-layer OCP film over time, as illustrated in FIG. 22, it is inferred that in the PBS solution, surrounding ions and water diffuse into the hydrated layer of the single-layer OCP film, thus causing swelling of the layered structure. This diffusion likely leads to the reaction of $HPO_4^{2-}$ present in the hydrated layers with water, resulting in conversion into $H_2PO_4$. The reaction equation here can be represented by: $HPO_4^{2-}+H_3O^+ \rightarrow H_2PO_4\text{-}\cdot H_2O$. Further, after 120 minutes of immersion, an increase in $PO_4^{3-}$ and a decrease in $HPO_4^{2-}$ were observed. This is presumably attributed to the predominant presence of the apatite layer because of the dissolution from the hydrated layer.

Figure 29:
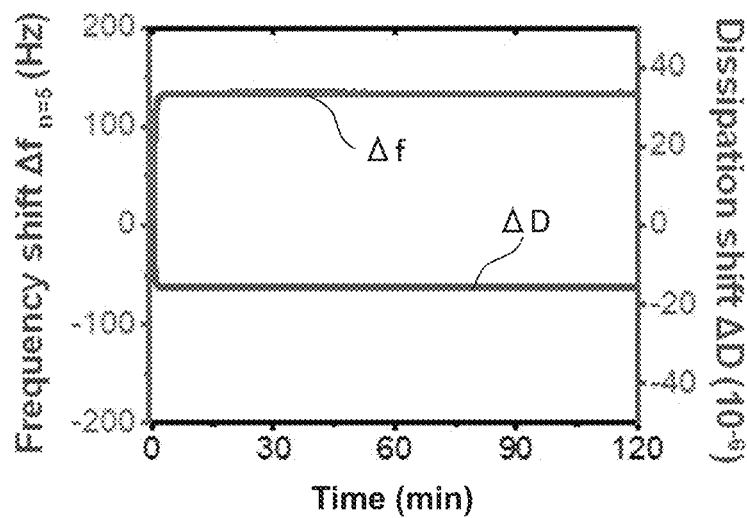
FIG. 29 illustrates a graph of weight changes over time and other characteristics of the single-layer OCP film in a citric acid buffer solution.
Figure 30:
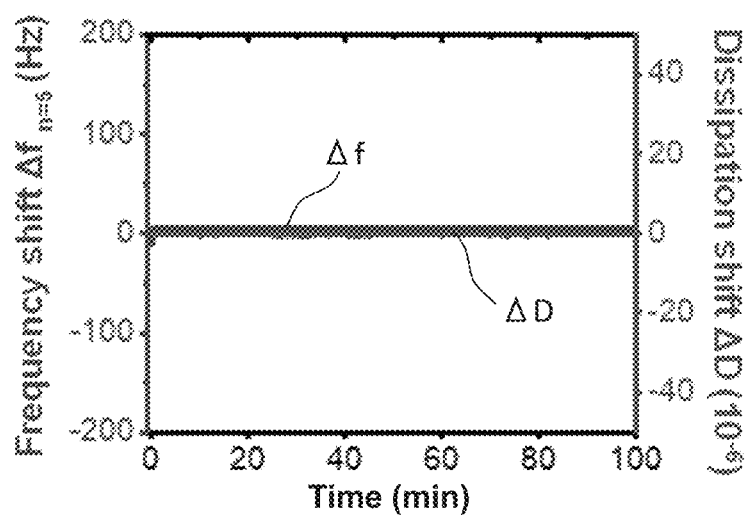
FIG. 30 illustrates a graph of weight changes over time and other characteristics of the hydroxyapatite film in the citric acid buffer solution.

FIG. 29 illustrates weight changes over time of the single-layer OCP film in a citric acid buffer solution (pH=6) etc. FIG. 30 illustrates weight changes over time of the hydroxyapatite film etc., under the same conditions as above. In FIGS. 29 and 30, the scale on the left vertical axis represents the frequency shift Δf of a quartz crystal, and the scale on the right vertical axis represents amplitude dissipation shift ΔD. Overtone number n used in the evaluation was n=5.

FIGS. 29 and 30 show that the single-layer OCP film exhibits a behavior different from the behavior of the hydroxyapatite film. More specifically, the hydroxyapatite film exhibits an increase in Δf and a decrease in ΔD, indicating a behavior of dissolving in the citrate buffer solution. In contrast, the single-layer OCP film exhibits a significantly different behavior from the behavior of the hydroxyapatite film, and shows almost no changes in Δf and ΔD. Thus, it has been confirmed that almost no swelling and dissolution occur in the single-layer OCP film. This indicates that stable sensing can be achieved using a sensor on which the single-layer OCP film is formed.

Figure 31A:
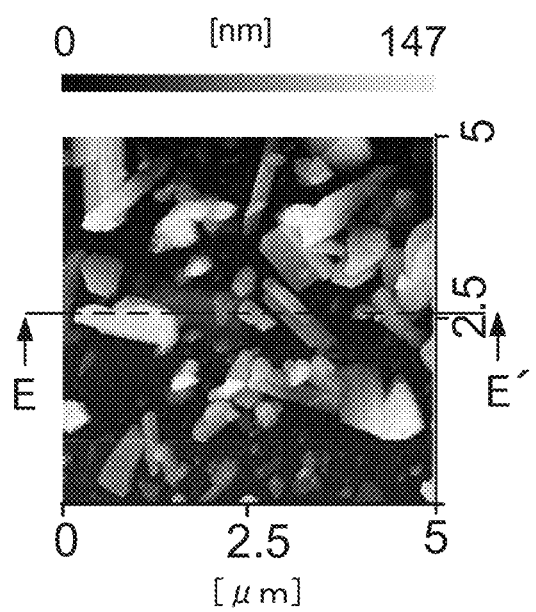
FIGS. 31A to 31F illustrate AFM images of the single-layer OCP crystalline film immersed in the PBS solution.
Figure 31B:
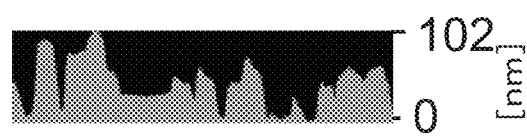

FIGS. 31A to 31F illustrate AFM (atomic force microscopy) images of the single-layer OCP crystalline film immersed in the PBS solution. FIG. 31A illustrates an AFM image of the single-layer OCP crystalline film with an immersion duration of 0 minutes. FIG. 31B is a cross-sectional view of the single-layer OCP crystalline film illustrated in FIG. 31A, cut along a line indicated by arrows E-E'.

Figure 31C:
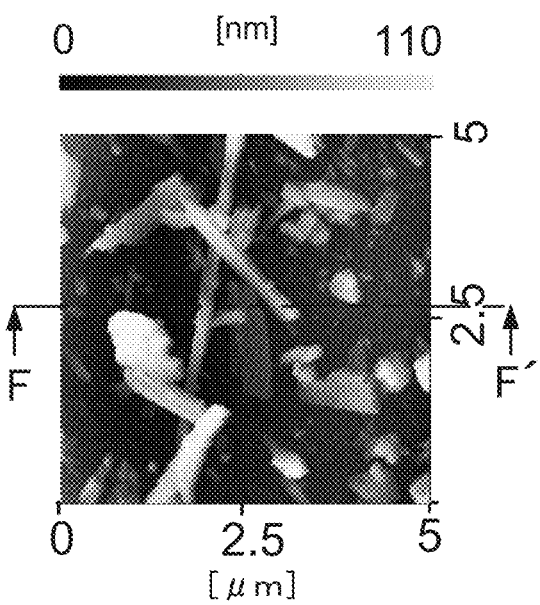
Figure 31D:
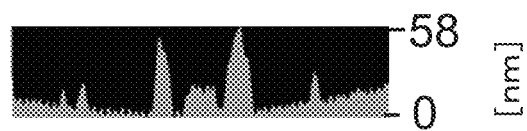
Figure 31E:
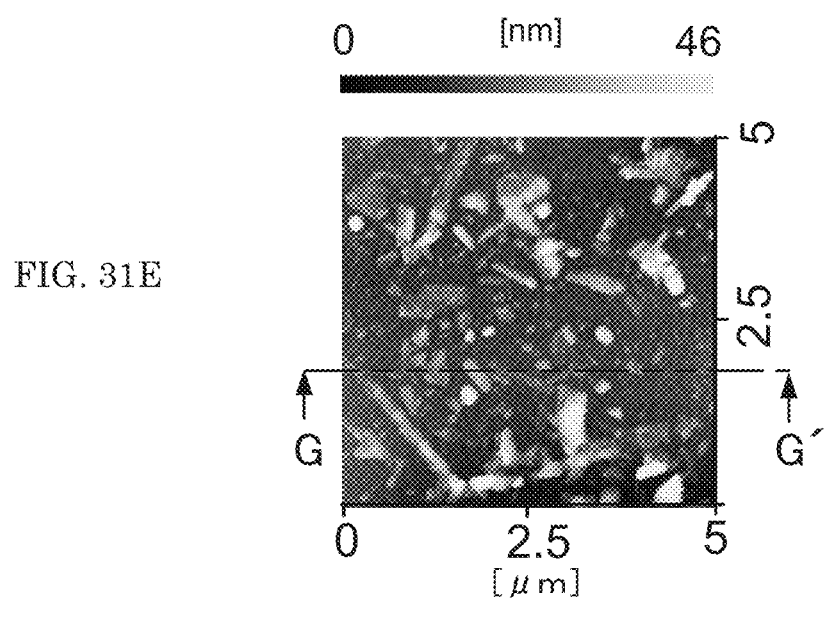
Figure 31F:
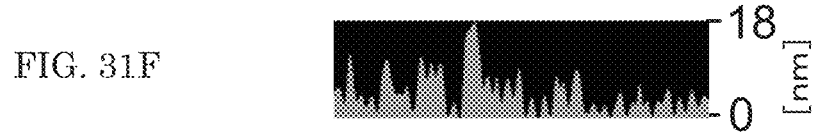

Similarly, FIG. 31C illustrates an AFM image of the single-layer OCP crystalline film immersed in the PBS solution for 5 minutes. FIG. 31D is cross-sectional view of the single-layer OCP crystalline film illustrated in FIG. 31C, cut along a line indicated by arrows F-F'. FIG. 31E illustrates an AFM image of the single-layer OCP crystalline film with an immersion duration of 120 minutes. FIG. 31F is a cross-sectional view of the single-layer OCP crystalline film illustrated in FIG. 31E, cut along a line indicated by arrows G-G'.

Considering the AFM images of the single-layer OCP crystalline film illustrated in FIG. 31A to 31F in conjunction with the spectrum waveforms illustrated in FIG. 26, it can be understood that when the single-layer OCP crystalline film becomes thinner due to immersion in the PBS solution, the crystalline film dissolves from the (100) plane of the OCP crystal. This may be caused by the following behavior. Since the plate shape of the crystal remains unchanged during thinning of the crystalline film, it can be understood that in the single-layer OCP film with a layered structure, the hydrated layers and the apatite layers detach one after another from the (100) plane.

According to the embodiment as described above, a stable crystalline film made of octacalcium phosphate arranged in a single-layer state, can be formed on the surface of a substrate (gold sensor), where the crystalline film has a layered structure in which a hydrated layer and an apatite layer are regularly repeated with the hydrated layer constituting the uppermost layer. More specifically, it has become possible to form a single-layer film on a substrate where the (100) plane of the octacalcium phosphate crystal is exposed outward on the outermost surface without being covered by other crystals. This enables a better understanding of how octacalcium phosphate degrades and is resorbed in the body, as well as dissolution behavior of octacalcium phosphate in biological fluids, etc., thereby facilitating a wide range of applications in fields of biotechnology and medicines.

When bone defect part is covered by a layered octacalcium phosphate crystalline film detached from a substrate, fusion between OCP and bone tissue and interactions between OCP and collagen structures are promoted, thereby enabling osteoclast adhesion to the (100) plane of the crystal, enhancement of osteoblast differentiation, and protein interactions, aiding bone regeneration. Thus, reaction behaviors such as adsorption of proteins on the surface of the crystalline film in biological fluids can be elucidated and controlled. This enables a wide application of octacalcium phosphate crystalline films in the fields of biotechnology and medicine.

In the single-layer OCP crystalline film, the (100) plane exposed on the surface of the film represents the largest plane of the OCP crystal. Since the plane has surface active sites where chemical reactions occur and is charged, the plane has high adsorption capability, and hydrogen bonding occurs due to the outermost hydrated layer, enabling the single-layer OCP crystalline film to be used as a drug carrier.

Additionally, adsorption of a drug onto the (100) plane of the single-layer OCP crystalline film and introduction of the drug into a body allow the drug release into a physiological fluid environment. This release is facilitated by the cleavage of water-mediated bonds between OCP and the drug, followed by the formation of hydrogen bonds between the drug and water molecules.

INDUSTRIAL APPLICABILITY

This can be applied generally to the formation of octacalcium phosphate crystal coatings on conductive solid surfaces, such as of medical instruments. Also, coating a sensor surface with an octacalcium phosphate crystal can be applied to study of reactions of layered OCP compounds, study of how bones and teeth form, and examining phase transition behavior of calcium phosphate.

REFERENCE SIGNS LIST

1 Plate-like crystal
2 Amorphous crystal
4 OCP particle
10 OCP crystal ethanol dispersion
11 Hydrated layer
12 Apatite layer
13 Plate crystal
14 Glass container
15 Amorphous particle
17 Counter electrode
18 Gold sensor
19 DC power source

The invention claimed is:

1. A crystalline film comprising a plate crystal of octacalcium phosphate arranged in a single layer state, where the plate crystal has a longitudinal dimension with a distribution range of 50 nm to 10 µm, a transverse dimension with a distribution range of 5 nm to 1000 nm, and an aspect ratio of 2 to 100 obtained by dividing the longitudinal dimension by the transverse dimension,
wherein a specific crystal plane of the plate crystal is oriented in a specific direction, where the specific direction is a surface direction of the crystalline film, and the specific crystal plane is preferentially exposed on a surface of the crystalline film over other crystal planes of the plate crystal excluding the specific crystal plane, and
wherein the crystalline film is formed on a surface of a conductive substrate.

2. The crystalline film according to claim 1, wherein the conductive substrate is made of a conductive material selected at least from gold, titanium, chromium, and silicon.

3. The crystalline film according to claim 1, wherein the specific crystal plane is exposed in a thickness direction of the crystalline film and in a direction opposite to the conductive substrate.

4. The crystalline film according to claim 1, wherein the crystalline film has a flat smoothness with an average root mean square roughness of 200 nm or less, preferably 100 nm or less, in a measurement range of 5 µm×5 µm on the surface of the crystalline film, and has a film thickness of 200 nm or less, preferably 50 nm or less.

5. The crystalline film according to claim 1, wherein the crystalline film has adhesion properties that the crystalline film does not detach from the conductive substrate even after being subjected to ultrasonic cleaning in ethanol at a frequency of 40 kHz for 1 minute.

6. The crystalline film according to claim 3, wherein crystals in the crystalline film have a layered structure in which a hydrated layer and an apatite layer alternate repeatedly, the hydrated layer being an uppermost layer exposed in the thickness direction of the crystalline film and in the direction opposite to the conductive substrate.

7. The crystalline film according to claim 1, wherein the specific crystal plane is a (100) plane.

8. A method of producing a crystalline film comprising the steps of:
synthesizing an octacalcium phosphate crystal (OCP crystal) by wet synthesis;
preparing an ethanol dispersion of the OCP crystal;
forming a multilayer deposited film of the OCP crystal on a cathode by electrophoresis in which the cathode is an electrode made of a conductive material selected at least from gold, titanium, chromium, and silicon; and
performing ultrasonic cleaning of the multilayer deposited film to form a single-layer deposited film of the OCP crystal on the cathode.

9. The method of producing the crystalline film, according to claim 8, wherein the single-layer deposited film is a crystalline film in which a (100) plane of the OCP crystal is oriented in a surface direction of the deposited film and preferentially exposed on a surface of the deposited film over other crystal planes of the OCP crystal excluding the (100) plane,
wherein the OCP crystal has a longitudinal dimension with a distribution range of 50 nm to 10 µm, a transverse dimension with a distribution range of 5 nm to 1000 nm, and an aspect ratio of 2 to 100 obtained by dividing the longitudinal dimension by the transverse dimension, and wherein the single-layer deposited film is formed on a surface of a conductive substrate serving as the cathode, having a flat smoothness with an average root mean square roughness of 200 nm or less, preferably 100 nm or less, in a measurement range of 5 μm×5 μm on the surface of the deposited film, having a film thickness of 200 nm or less, preferably 50 nm or less, and having adhesion properties that the deposited film does not detach from the conductive substrate even after being subjected to ultrasonic cleaning in ethanol at a frequency of 40 kHz for 1 minute.

10. The method of producing the crystalline film, according to claim 9, wherein crystals in the single-layer deposited film have a layered structure in which a hydrated layer and an apatite layer alternate repeatedly, the hydrated layer being an uppermost layer exposed in a thickness direction of the single-layer deposited film and in the direction opposite to the conductive substrate.

11. The method of producing the crystalline film, according to claim 8, wherein an electrophoresis duration for forming the multilayer deposited film by the electrophoresis is at least 1 minute.

12. A Quartz Crystal Microbalance (QCM) sensor coated with the crystalline film according to claim 1 on a conductive substrate, wherein a (100) plane of a plate crystal of octacalcium phosphate constituting the crystalline film is preferentially exposed on a surface of the crystalline film over other crystal planes of the plate crystal excluding the (100) plane.

* * * * *